(12) United States Patent
Ostrowski et al.

(10) Patent No.: US 12,085,609 B1
(45) Date of Patent: Sep. 10, 2024

(54) THERMAL CONTROL WAFER WITH INTEGRATED HEATING-SENSING ELEMENTS

(71) Applicant: AEM Singapore Pte. Ltd., Singapore (SG)

(72) Inventors: Carl L. Ostrowski, Milford, MI (US); Terry Sinclair Connacher, Tempe, AZ (US); Samer Kabbani, Laguna Niguel, CA (US); Enrique Aleman, Temecula, CA (US); Thomas P. Jones, Stanwood, MI (US); Sorin Dinescu, Temecula, CA (US)

(73) Assignee: AEM Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/454,737

(22) Filed: Aug. 23, 2023

(51) Int. Cl.
*G01R 31/28* (2006.01)
(52) U.S. Cl.
CPC ................... *G01R 31/2875* (2013.01)
(58) Field of Classification Search
CPC ............ G01R 31/2607; G01R 31/2874; G01R 31/2891
See application file for complete search history.

(56) References Cited

U.S. PATENT DOCUMENTS

| | | | |
|---|---|---|---|
| 5,280,422 A | 1/1994 | Moe et al. | |
| 5,521,850 A | 5/1996 | Moe et al. | |
| 6,225,608 B1 | 5/2001 | Kaellgren | |
| 6,549,026 B1 * | 4/2003 | DiBattista | G01R 31/2874 324/750.09 |
| 6,583,638 B2 | 6/2003 | Costello et al. | |
| 6,825,681 B2 | 11/2004 | Feder et al. | |
| 6,985,000 B2 | 1/2006 | Feder et al. | |
| 6,992,500 B2 | 1/2006 | Sugiyama et al. | |

(Continued)

FOREIGN PATENT DOCUMENTS

| | | |
|---|---|---|
| EP | 0947903 A1 | 10/1999 |
| EP | 2316286 A1 | 5/2011 |

(Continued)

OTHER PUBLICATIONS

Notice of Allowance dated Jul. 11, 2023, for U.S. Appl. No. 18/311,164, filed May 2, 2023, eight pages.

(Continued)

*Primary Examiner* — Tung X Nguyen
(74) *Attorney, Agent, or Firm* — Morrison & Foerster LLP

(57) ABSTRACT

Disclosed herein are systems and methods comprising a thermal control wafer (TCW) comprising a plurality of heater zones. A heater zone may comprise a heater-sensing element that generates heat during a heating mode and provides a resistance during a sensing mode. During testing, a wafer under test (WUT) may be placed on top of a chuck assembly. The TCW may be part of or separate from the chuck assembly. Controlling one or more heater zones on the TCW may control the temperatures of DUT(s) while being tested. The thermal controller may comprise a plurality of thermal control channel multiplexed to a plurality of heater zones. E.g., one or more first heater zones can be activated at a first time, one or more second heater zones can be activated at a second time, one or more third heater zones can be activated at a third time, etc.

28 Claims, 12 Drawing Sheets

(56) References Cited

U.S. PATENT DOCUMENTS

| | | |
|---|---|---|
| 7,196,295 B2 | 3/2007 | Fennewald et al. |
| 7,601,935 B2 | 10/2009 | Fennewald et al. |
| 8,289,040 B2 | 10/2012 | Komoto et al. |
| 8,680,443 B2 | 3/2014 | Mcmillin et al. |
| 9,713,345 B2 | 7/2017 | Farine et al. |
| 10,104,718 B2 | 10/2018 | Wallinger |
| 10,760,465 B2 | 9/2020 | Everly et al. |
| 10,934,921 B2 | 3/2021 | Culbertson et al. |
| 11,340,283 B2 | 5/2022 | Kasai et al. |
| 11,674,999 B2 | 6/2023 | Kabbani et al. |
| 11,828,796 B1 | 11/2023 | Ostrowski et al. |
| 2006/0164111 A1 | 7/2006 | Lopez et al. |
| 2007/0138166 A1 | 6/2007 | Fennewald et al. |
| 2009/0265045 A1 | 10/2009 | Coxe, III |
| 2010/0086991 A1 | 4/2010 | Fish |
| 2011/0022324 A1 | 1/2011 | Knopp et al. |
| 2011/0095777 A1 | 4/2011 | Komoto |
| 2012/0049874 A1 | 3/2012 | Lacroix |
| 2012/0292308 A1 | 11/2012 | Fennewald et al. |
| 2014/0139246 A1 | 5/2014 | Chuang et al. |
| 2018/0196084 A1 | 7/2018 | Tustaniwskyj |
| 2019/0086468 A1 | 3/2019 | Yoshino |
| 2019/0391335 A1 | 12/2019 | Tan |
| 2020/0092951 A1 | 3/2020 | Fennewald et al. |
| 2020/0203240 A1 | 6/2020 | Haehn |
| 2020/0284180 A1 | 9/2020 | Everly et al. |
| 2020/0329533 A1 | 10/2020 | Wallinger et al. |
| 2021/0033666 A1 | 2/2021 | Kasai |
| 2021/0037676 A1 | 2/2021 | Malouin |
| 2021/0263542 A1* | 8/2021 | Breitlow ............ G05D 23/1934 |
| 2021/0302501 A1 | 9/2021 | Su |
| 2022/0053609 A1 | 2/2022 | Phillips |
| 2022/0155364 A1 | 5/2022 | Kabbani et al. |
| 2022/0155384 A1 | 5/2022 | Lovati |
| 2022/0221509 A1 | 7/2022 | Kasai |

FOREIGN PATENT DOCUMENTS

| | | |
|---|---|---|
| JP | 2001210683 A | 8/2001 |
| WO | 2022053782 A1 | 3/2022 |

OTHER PUBLICATIONS

Notice of Allowance dated Aug. 16, 2023, for U.S. Appl. No. 18/311,164, filed May 2, 2023, seven pages.

Non-Final Office Action dated Dec. 7, 2023, for U.S. Appl. No. 18/471.192, filed Sep. 20, 2023, six pages.

Non-Final Office Action dated Nov. 24, 2023, for U.S. Appl. No. 18/454,741, filed Aug. 23, 2023, six pages.

Notice of Allowance (corrected) dated Aug. 31, 2023, for U.S. Appl. No. 18/311,164 filed May 2, 2023, four pages.

Non-Final Office Action mailed Mar. 22, 2024, for U.S. Appl. No. 18/390,935, filed Dec. 20, 2023, twenty pages.

Non-Final Office Action mailed Mar. 8, 2024, for U.S. Appl. No. 18/390,951, filed Dec. 20, 2023, seventeen pages.

Notice of Allowance mailed Apr. 1, 2024, for U.S. Appl. No. 18/390,918, filed Dec. 20, 2023, seven pages.

Notice of Allowance mailed Apr. 4, 2024, for U.S. Appl. No. 18/471,192, filed Sep. 20, 2023, seven pages.

Notice of Allowance mailed Mar. 1, 2024, for U.S. Appl. No. 18/454,741, filed Aug. 23, 2023, seven pages.

* cited by examiner

THERMAL CONTROL WAFER WITH INTEGRATED HEATING-SENSING ELEMENTS

FIELD

The present disclosure relates to methods and systems for controlling one or more temperatures of integrated circuit (IC) wafers or chips, and more specifically, controlling a thermal control wafer, such as during wafer probe testing.

BACKGROUND

Prior to shipping to an end user, IC chips are tested to ensure their performances meet certain performance criteria. It is desirable to test these IC chips as early as possible in the manufacturing process so that any IC chips that do not meet the performance criteria are removed from the process before further expensive processing steps are applied. The process for manufacturing chips may comprise manufacturing semiconductor IC devices, transistors, diodes, passive components, micro-electromechanical systems (MEMS), or other types of devices on a semiconductor wafer and interconnecting those devices on the wafer to form circuits, sensors, or other functional units. The circuits, sensors, or other functional units are combined to provide desired functions within a physical outline on the wafer (e.g., are organized as chips). There may be tens or thousands of chips on an individual wafer depending on the wafer size and the chip or die size. Electrically testing individual IC chips while still part of a semiconductor wafer is referred to as "wafer probe" testing. A wafer probe test is used to determine which IC chips are defective and which are considered good due to passing the wafer probe test. The wafer probe test involves using a wafer prober interface as an interface with a test system. The wafer probe interface comprises contacts such as needles (also referred to as probe pins) that are temporarily configured to electrically couple with electrical pads formed on the IC chip during a test sequence. The electrical pads are formed while the IC chip is part of the semiconductor wafer. One or more signals, such as power and input/output signals, are applied by the wafer probe interface to the electrical pads of the IC chips. For example, a test pattern is applied during the wafer probe test.

After the wafer probe test, the semiconductor wafer is cut into individual (also referred to as singulated) IC chips, which are then assembled into packages to result in packaged IC chip components. The packaged IC chip components are subject to one or more other electrical tests, such as package-level testing that may include burn-in testing, functional testing, or system level testing. Package-level testing may be the final test performed while an IC chip component is in a packaged state. After the final (package-level) test, the IC chip components are assembled into systems, which may comprise, e.g., being soldered onto printed circuit boards.

The wafer probe testing and the package-level testing can be very sophisticated, using technologically advanced testers, where the amount of time for testing can be greater than tens of seconds per IC chip or IC chip component. Advanced testers may cost several millions of dollars each. For both wafer probe testing and package-level testing, the IC chips or packaged IC chip components may be tested at different set point temperatures, where the temperatures of the IC chips or packaged IC chip components must be accurate and stable while the testing is performed. A thermal controller determines the temperature of the device under test (DUT) (e.g., IC chips or packaged IC chip components) and/or the temperature of a thermal control element that is in close proximity to the DUT. In some instances, a tester may determine the temperature of the DUT (e.g., using an on-chip temperature sensor) and send it to the thermal controller. If the determined temperature is outside of a desired range around a set point temperature, then the thermal controller attempts to heat or cool the DUT or thermal control element. The thermal controller waits until the DUT temperature and/or thermal control element temperature is within the desired range, or stops testing. Since the test system can be very expensive, time that a test system sits idle waiting (e.g., not performing a test) can lead to significant amounts of money lost.

For wafer probe testing, heating or cooling a DUT may comprise using a thermal mass (e.g., heated and/or cooled chuck) that the semiconductor wafer thermally couples to during testing. For example, before testing, the semiconductor wafer may be placed on a chuck (sometimes referred to as chuck assembly) that includes thermal control elements. The wafer prober changes the temperature of the thermal control elements to a set point temperature or maintains it, which then affects the temperature of the semiconductor wafer. However, the thermal control elements may not adequately respond to localized temperature changes that occur due to, e.g., individual high-performance IC chips being tested when operating with its targeted performance, limiting the wafer probe testing of certain IC chips. Furthermore, the wafer probe test system or thermal control elements, due to, e.g., their large thermal mass, may not be able to quickly transition from one set point temperature to another. Any delay in transitioning from one temperature to another is costly since the tester is idle and not utilized during the temperature transition. In some instances, when a high-powered IC chip is being tested, the thermal control elements may not be able to change temperatures fast enough to keep the IC chip within an acceptable temperature range. In some instances, the temperature of the IC chip may become too high, damaging the probe card.

Systems and methods that adequately respond to localized temperature changes, transition quickly from one set point temperature to another, and reduce overall testing costs and times may be desired.

SUMMARY

An apparatus for controlling one or more temperatures of a plurality of heater zones related to devices under test (DUTs) is disclosed. The apparatus comprises: a thermal control wafer (TCW) comprising the plurality of heater zones, wherein the plurality of heaters zones is independently controllable and configured to heat the DUTs, wherein at least one of the plurality of heater zones has: a heater-sensing element comprising a resistive trace that: generates heat through Joule heating during a heating mode, and provides a resistance during a sensing mode; and a thermal controller configured to determine a temperature of the at least one heater zone based on the resistance.

Additionally or alternatively, in some embodiments, at least one of the DUTs comprises a chip on a semiconductor wafer; and the at least one heater zone has an area that is substantially the same as an area of the chip.

Additionally or alternatively, in some embodiments, at least one of the DUTs comprises a group of chips on a semiconductor wafer; and the at least one heater zone has an area that is substantially the same as an area of the group of chips.

Additionally or alternatively, in some embodiments, at least one of the DUTs comprises a chip on a semiconductor wafer; the at least one heater zone has an area that is smaller than an area of the chip; and a combined area of at least two of the plurality of heater zones is substantially the same as the area of the chip.

Additionally or alternatively, in some embodiments, at least one of the DUTs comprises a chip or a group of chips on a semiconductor wafer; and the at least one heater zone has an area that is larger than an area of the chip or the group of chips.

Additionally or alternatively, in some embodiments, the TCW has an area that is substantially the same as an area of a wafer under test (WUT), the WUT comprising one or more of the DUTs.

Additionally or alternatively, in some embodiments, a diameter of the TCW is about 150 mm, 200 mm, or 300 mm, and a thickness of the TCW is 3 mm or less.

Additionally or alternatively, in some embodiments, the apparatus further comprises: a coldplate disposed under the TCW, wherein the TCW is disposed above the DUTs.

Additionally or alternatively, in some embodiments, the apparatus further comprises: a thermal interface material (TIM), wherein the TIM is located between the TCW and the coldplate, between the TCW and a wafer under test (WUT), or both, wherein the WUT comprises one or more of the DUTs.

Additionally or alternatively, in some embodiments, a thermal conductivity of the TIM is between 1 to 10 W/mK.

Additionally or alternatively, in some embodiments, the TIM is located between the TCW and the coldplate, and a thermal conductivity of the TIM is about 0.2 W/mK.

Additionally or alternatively, in some embodiments, the apparatus further comprises: a thermal interface material (TIM) disposed between a surface of the TCW and a wafer under test (WUT), wherein the TIM comprises water.

Additionally or alternatively, in some embodiments, the apparatus further comprises: a pump that dispenses at least some of the water on the surface of the TCW during testing.

Additionally or alternatively, in some embodiments, the TCW is capable of absorbing or removing water from a surface of the TCW between test runs.

Additionally or alternatively, in some embodiments, the TCW comprises one or more layers of inorganic dielectric material and one or more layers of conductive material.

Additionally or alternatively, in some embodiments, the TCW comprises a base metal layer, the one or more layers of inorganic dielectric material and the one or more layers of conductive material are disposed over the base metal layer.

Additionally or alternatively, in some embodiments, the plurality of heater zones comprises a plurality of heater-sensing elements, and wherein the resistive traces of the plurality of heating-sensing elements are on one conductive layer.

Additionally or alternatively, in some embodiments, the plurality of heater zones comprises a plurality of heater-sensing elements, and wherein the resistive traces of the plurality of heating-sensing elements are located on two or more conductive layers.

Additionally or alternatively, in some embodiments, the at least one of the plurality of heater zones comprises two or more resistive traces.

Additionally or alternatively, in some embodiments, the two or more resistive traces are electrically coupled together in series or in parallel.

Additionally or alternatively, in some embodiments, the TCW comprises: conductive traces having a width that is at least five times wider than widths of the resistive traces of the heating-sensing elements.

Additionally or alternatively, in some embodiments, the TCW comprises: a first conductive layer comprising the resistive trace of the heater-sensing element of the at least one heater zone; a second conductive layer configured as a shield layer, wherein the second conductive layer is located closer to an upper surface of the TCW than the first conductive layer, wherein the upper surface of the TCW is configured for contacting a wafer under test (WUT), the WUT comprising one or more of the DUTs, wherein the shield layer is coupled to an electrical ground.

Additionally or alternatively, in some embodiments, the TCW comprises: interconnect traces configured to form one or more four-wire connections, wherein the resistive trace of the heating-sensing element is electrically coupled to at least one of the one or more four-wire connections.

Additionally or alternatively, in some embodiments, wires of at least one of the one or more four-wire connections are located on different conductive layers of the TCW.

Additionally or alternatively, in some embodiments, the TCW comprises: interconnect traces configured to form one or more two-wire connections, wherein the resistive trace of the heating-sensing element is electrically coupled to at least one of the one or more two-wire connections.

Additionally or alternatively, in some embodiments, the TCW comprises: a plurality of pins electrically coupling the one or more two-wire connections to one or more four-wire connections, wherein the one or more four-wire connections electrically couples to circuitry.

Additionally or alternatively, in some embodiments, a wire of at least one of the one or more two-wire connections is located on different conductive layers of the TCW.

Additionally or alternatively, in some embodiments, a top surface of the TCW is electrically coupled to ground and is configured to dissipate electrostatic charges.

Additionally or alternatively, in some embodiments, the TCW comprises: conductive traces having an electrical resistivity that is 2-4 times less than an electrical resistivity of the resistive traces of the heating-sensing elements.

An apparatus for controlling one or more temperatures of a plurality of heater zones related to devices under test (DUTs) is disclosed. The apparatus comprises: a thermal control wafer (TCW) comprising the plurality of heater zones, wherein the plurality of heaters zones is independently controllable and configured to heat the DUTs, wherein at least one of the plurality of heater zones has: a heater-sensing element comprising a resistive trace that: generates heat through Joule heating during a heating mode, and provides a resistance during a sensing mode; and a thermal controller comprising a plurality of thermal control channels multiplexed to the plurality of heater zones.

Additionally or alternatively, in some embodiments, each of the plurality of thermal control channels is multiplexed to a unique heater zone of the plurality of heater zones.

Additionally or alternatively, in some embodiments, the thermal controller is capable of maintaining a temperature of the at least one heater zone to within 0.1% of a set point temperature.

Additionally or alternatively, in some embodiments, the plurality of heater zones is configured as rows of heater zones, columns of heater zones, or a combination thereof.

Additionally or alternatively, in some embodiments, the plurality of independently controllable heater zones is configured as concentric rings, concentric arcs, or sectors of heater zones.

Additionally or alternatively, in some embodiments, the thermal controller is configured to: activate the at least one heating zone by selecting a row and a column corresponding to the at least one heating zone.

Additionally or alternatively, in some embodiments, the thermal controller is configured to: activate one or more first heating zones corresponding to one or more first DUTs at a first time; and activate one or more second heating zones corresponding to one or more second DUTs at a second time.

Additionally or alternatively, in some embodiments, the thermal controller is configured to: activate the plurality of heating zones based on an addressing scheme or stepping pattern.

Additionally or alternatively, in some embodiments, the thermal controller is configured to determine an amount of power supplied to the plurality of heater zones.

Additionally or alternatively, in some embodiments, the apparatus further comprises: a coldplate disposed under the TCW, wherein the TCW is disposed above the DUTs, wherein the thermal controller is configured to control a fluid flow rate through the coldplate based on the determined amount of power.

Additionally or alternatively, in some embodiments, the apparatus further comprises: a coldplate disposed under the TCW, wherein the TCW is disposed above the DUTs, the coldplate comprising a plurality of cooling channels that allows a coolant to flow through to cool or maintain a temperature of the coldplate below a temperature of the TCW.

Additionally or alternatively, in some embodiments, the thermal controller is configured to: receive an input indicative of a DUT power, a DUT temperature, or both; and control an amount of power to supply at least one of the plurality of thermal control channels based on the input.

Additionally or alternatively, in some embodiments, the thermal controller is configured to: determine a temperature of the at least one heater zone; receive an input indicative of a DUT power, a DUT temperature, or both; and control an amount of power to supply at least one of the plurality of thermal control channels based on the input and the determined temperature.

Additionally or alternatively, in some embodiments, the thermal controller is configured to: receive an input indicative of a location of one or more DUTs being tested; and control one or more heater zones associated with the location.

Additionally or alternatively, in some embodiments, the thermal controller is configured to: determine a temperature of the at least one heater zone by comparing the resistance of the resistive trace to calibration data, wherein the calibration data include a correlation between resistance and temperature.

Additionally or alternatively, in some embodiments, the calibration data is pre-determined by: measuring the resistance of a resistive trace at a plurality of different temperatures; and storing the correlation between the resistance and temperature.

Additionally or alternatively, in some embodiments, the thermal controller is configured to: determine an amount of power to supply to at least one of the plurality of thermal control channels by using a PID algorithm.

Additionally or alternatively, in some embodiments, the amount of power supplied to the at least one thermal control channel is regulated by a pulse width modulation (PWM) scheme.

Additionally or alternatively, in some embodiments, the thermal controller comprises an FPGA.

Additionally or alternatively, in some embodiments, the apparatus further comprises: a failsafe circuit configured to, in accordance with meeting one or more criteria, during the heating mode of the heater-sensing element, prevent at least one thermal control channel from providing power to the at least one heater-sensing element.

Additionally or alternatively, in some embodiments, the thermal controller is further configured to: determine whether the one or more criteria have been met, the one or more criteria comprising: a temperature of at least one of the DUTs being greater than a temperature threshold, a power of at least one of the DUTs being greater than a power threshold, the heating-sensing element being shorted, or the heating-sensing element being an open circuit.

Additionally or alternatively, in some embodiments, the apparatus further comprises: a voltage source, wherein a first side of the voltage source is configured to be coupled to a conductive layer of the TCW, and a second side of the voltage source is configured to be coupled to a wafer under test (WUT), the WUT comprising one or more of the DUTs, wherein the TCW is configured as an electrostatic chuck to hold the WUT on the TCW when a voltage potential is applied using the voltage source.

Additionally or alternatively, in some embodiments, the conductive layer is configured as a shield layer.

Additionally or alternatively, in some embodiments, for the at least one heater zone, a rate of temperature change for heating is substantially the same as a rate of temperature change for cooling.

Additionally or alternatively, in some embodiments, the rate of temperature change for heating and the rate of temperature change for cooling is about 2° C. per second or more.

Additionally or alternatively, in some embodiments, the TCW comprises pins disposed on an outside portion of the TCW, wherein the pins electrically couple conductive layers of the TCW to a printed circuit assembly (PCA).

Additionally or alternatively, in some embodiments, the pins are soldered or brazed to pads on the TCW on one side of the TCW and are soldered to the PCA on another side of the TCW.

Additionally or alternatively, in some embodiments, the TCW comprises grooves or channels for distributing a vacuum to hold a wafer under test (WUT) to the TCW.

Additionally or alternatively, in some embodiments, the TCW comprises one or more dielectric layers, wherein the grooves or channels are formed in the one or more dielectric layers.

It will be appreciated that any of the variations, aspects, features, and options described in view of the systems and methods apply equally to the methods and vice versa. It will also be clear that any one or more of the above variations, aspects, features, and options can be combined. It should be understood that the invention is not limited to the purposes mentioned above, but may also include other purposes, including those that can be recognized by one of ordinary skill in the art.

Figure 1:
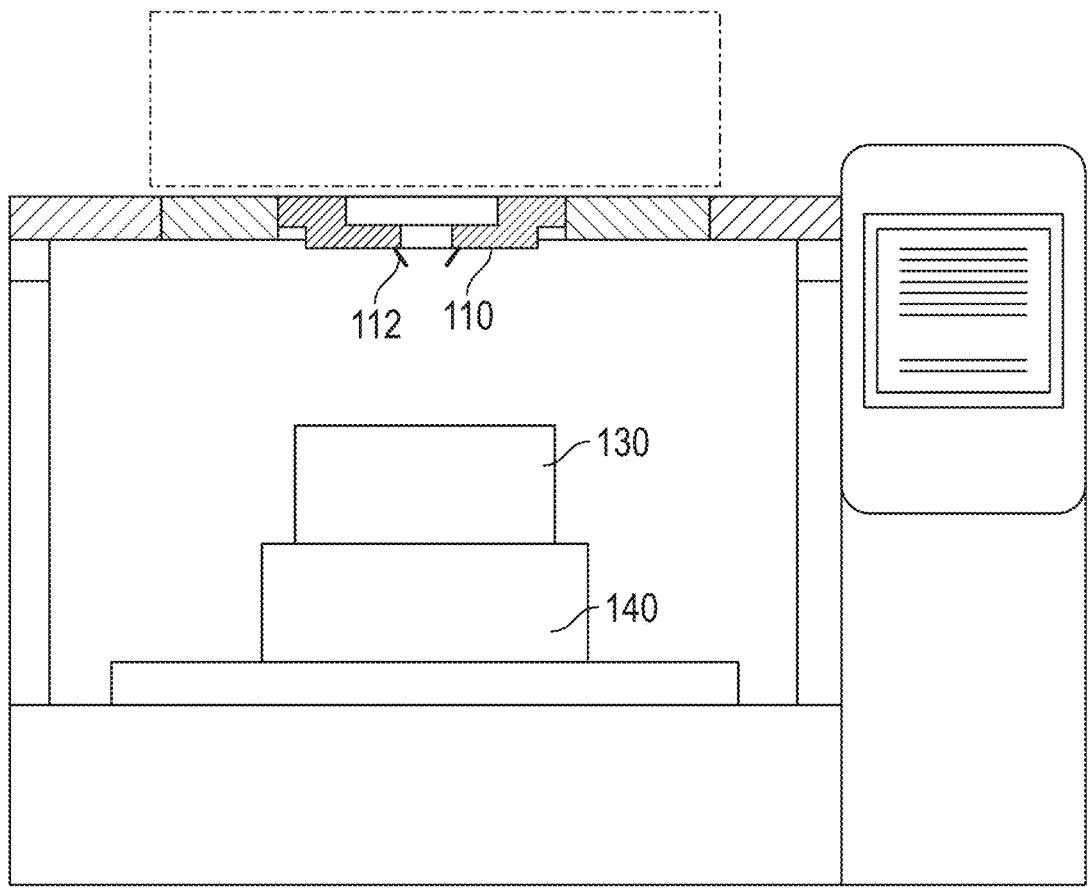
FIG. 1 illustrates a cross-sectional, schematic view of an example wafer prober, according to some embodiments.

It will be appreciated that any of the variations, aspects, features, and options described in view of the systems apply equally to the methods and vice versa. It will also be clear that any one or more of the above variations, aspects, features, and options can be combined.

DETAILED DESCRIPTION

Disclosed herein are systems and methods comprising a thermal control wafer (TCW) comprising a plurality of heater zones. A heater zone may comprise a heater-sensing element that generates heat during a heating mode and provides a resistance during a sensing mode. During testing, a wafer under test (WUT) may be placed on top of a chuck assembly. The TCW may be part of or separate from the chuck assembly. Controlling one or more heater zones on the TCW may control the temperatures of DUT(s) while being tested. The thermal controller may comprise a plurality of thermal control channel multiplexed to a plurality of heater zones. Heater zones may be activated (operating in heating mode) in groups. In some embodiments, less than all heater zones may be activated at the same time. For example, one or more first heater zones can be activated at a first time, one or more second heater zones can be activated at a second time, one or more third heater zones can be activated at a third time, etc. Although the disclosure herein is discussed specifically in the context of wafer probe testing, aspects of the disclosure apply to other applications including, but not limited to, semiconductor fabrication operations, food or chemical processing, biological or biochemical applications, or a variety of other applications.

The following description is presented to enable a person of ordinary skill in the art to make and use various embodiments. Descriptions of specific devices, techniques, and applications are provided only as examples. These examples are being provided solely to add context and aid in the understanding of the described examples. It will thus be apparent to a person of ordinary skill in the art that the described examples may be practiced without some or all of the specific details. Other applications are possible, such that the following examples should not be taken as limiting. Various modifications in the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to a person of ordinary skill in the art, that one or more aspects and/or features described or referenced herein may be practiced without some or all of these specific details. In other instances, well-known process steps and/or structures have not been described in detail in order to not obscure some of the aspects and/or features described or referenced herein.

In the following description of examples, reference is made to the accompanying drawings which form a part hereof, and in which it is shown by way of illustration specific examples that can be practiced. It is to be understood that other examples can be used, and structural changes can be made without departing from the scope of the disclosed examples.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combination of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that the term "same," when used in this specification, refers to the stated feature as being identical or within a certain range (e.g., 1%, 5%, etc.) from identical.

FIG. 1 illustrates a cross-sectional, schematic view of an example wafer prober. The wafer prober 100 comprises a probe card 110, a chuck assembly 130, and a moving mechanism 140. The probe card 110 comprises a plurality of probes 112 for electrically coupling electrical pads formed on a wafer under test (WUT). The WUT may be placed on top of and temporarily secured by the chuck assembly 130 using, e.g., vacuum. The chuck assembly 130 may be located between the WUT and the moving mechanism 140 during testing. The moving mechanism 140 may move the chuck assembly 130 along one or more axes, such as in three dimensions along x, y, z, and/or rotational θ axes. The moving mechanism 140 may comprise alignment mechanisms such as cameras for aligning the WUT 201 and/or IC devices formed on the WUT 201 with the probe card 110.

In some embodiments, the wafer prober 100 may comprise a thermal control wafer (TCW) 236. The TCW 236 may comprise one or more heater zones. Controlling one or more heater zones on the TCW 236 may control the temperatures of one or more DUTs while being tested. In some embodiments, TCW 236 may be part of chuck assembly 230. In some aspects, TCW 236 may be separate from the chuck assembly. The TCW 236 may be located between a WUT 201 and a chuck assembly 230, which may be arranged on the moving mechanism 140 during testing.

Figure 2:
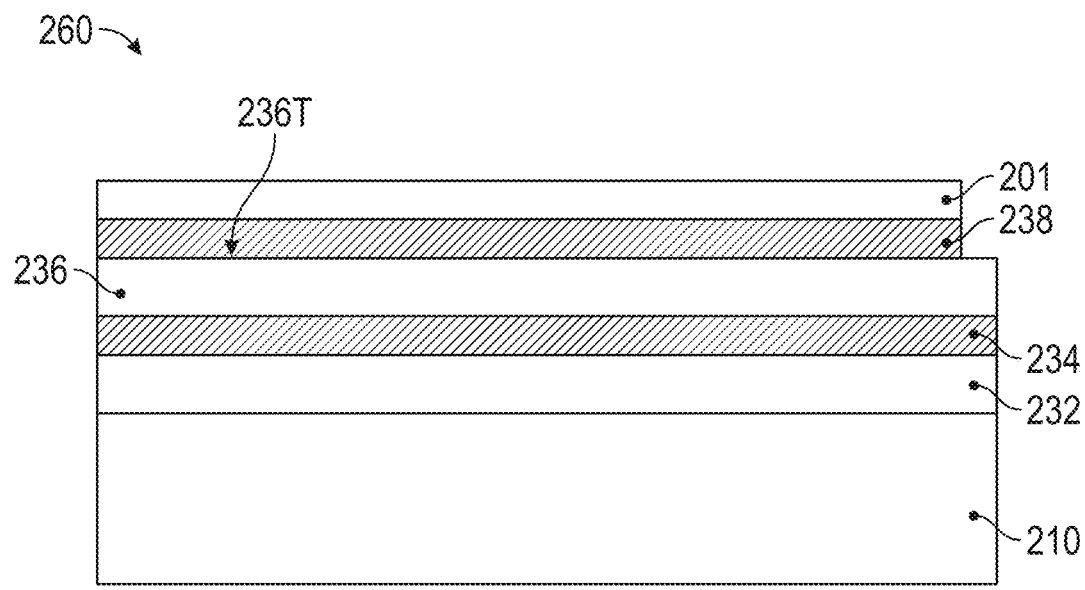
FIG. 2 illustrates a cross-sectional, schematic view of an example chuck assembly, according to some embodiments.

FIG. 2 illustrates a cross-sectional, schematic view of an example chuck assembly, according to some embodiments. The chuck assembly 230 may be similar to chuck assembly 130 of FIG. 1. Chuck assembly 230 may comprise a chuck base 210, a coldplate 232, a thermal interface material (TIM) 234, and a TCW 236. A WUT 201 may be placed on top of and temporarily secured by the chuck assembly 230 during testing. The chuck base 210 may be located at the bottom of the chuck assembly 230, e.g., furthest from the WUT 201 and closest to a moving mechanism (e.g., moving mechanism 140 of FIG. 1) relative to the other components within the chuck assembly 230. In some embodiments, a TIM 234 may be located between the coldplate 232 and the TCW 236. In some embodiments, the chuck assembly 230 may comprise a TIM 238 (sometimes referred to as a TIM layer) between the TCW 236 and the WUT 201.

The configuration and arrangement of the chuck assembly 230 may vary depending on one or more factors, such as the wafers to be tested or the wafer prober. In some cases, the chuck assembly 230 does not include a coldplate 232, as the wafers to be tested may not be actively cooled (e.g., by a coldplate). In some cases, the chuck assembly 230 does not include the TIM 234, as the thermal coupling between the coldplate 232 and TCW 236 is sufficient when they are placed adjacent to each other. The thermal coupling between the coldplate 232 and TCW 236 may be determined to be sufficient based on one or more thermal parameters.

The TCW 236 may be removably attached to the rest of the chuck assembly 230. For example, a first TCW 236 may be used for testing of a first set of WUTs 201, and a second TCW 236 may be used for testing a second set of WUTs 201. The first TCW 236 may be removed and replaced with the second TCW 236 accordingly. In some cases, one or more TCWs 236 can be stored within the wafer prober, such as in a storage drawer, and removing and/or replacing the first TCW 236 with the second TCW 236 can be partially or wholly automated within the wafer prober.

In some embodiments, the TCW 236 comprises a plurality of dielectric layers. A dielectric layer comprises a dielectric material such as ceramic, glass-ceramic, glass, an organic dielectric material, an inorganic dielectric material, or any other suitable dielectric material. A dielectric material may be determined to be suitable based on dielectric strength, mechanical strength, temperature range, manufacturability, availability, cost, etc.

Figure 3:
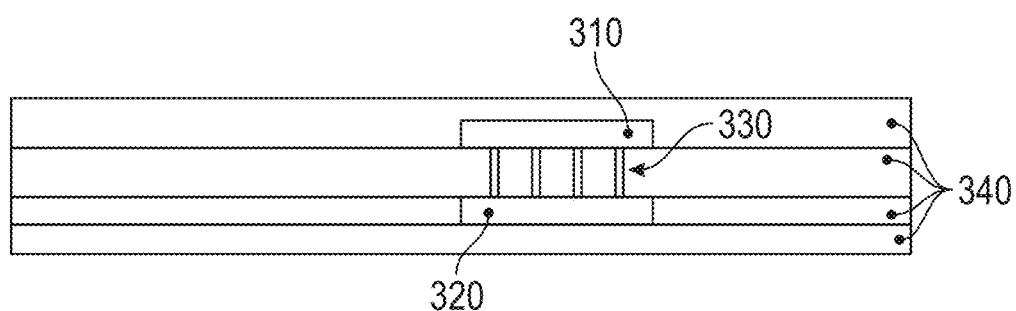
FIG. 3 illustrates an example cross-section view of an upper conductive element, according to some embodiments.

One example dielectric material is aluminum nitride (AlN). In some embodiments, a metal layer, such as an aluminum or stainless-steel layer, forms a base material, and a dielectric layer is formed on the first metal layer. In some embodiments, conductive traces or pads may be patterned on one or more of the dielectric layers, such as by thick film paste or ink screen printing, thin film deposition, or any other suitable method (e.g., as determined based on availability, cost, ability to achieve a target mechanical result, ability to achieve a target electrical result). In some embodiments, a dielectric layer comprises holes or openings for forming one or more vias. A via may be filled with a conductive material that electrically couples one conductive layer to another conductive layer in the TCW 236. To increase yield and reliability, in some embodiments, the TCW 236 comprises multiple vias electrically coupling the same layers, as shown in FIG. 3. FIG. 3 is an example cross-section view of an upper conductive element 310, such as a trace, and a lower conductive element 320 embedded within dielectric layers 340. In some embodiments, upper conductive element 310 may be embedded within dielectric layers 340.

Multiple vias 330 may electrically couple the upper conductive element 310 to the lower conductive element 320. If one or more of the multiple vias 330 electrically fails, one or more other vias 330 may provide an electrical coupling. The TCW 236 can be constructed of sheets of dielectric material with associated conductive layers that are stacked. The sheets of dielectric material may comprise a ceramic powder with binders and optionally other additives. The sheets of dielectric material may be stacked and pressed to form a single component. The sheets of dielectric materials may be fused together in either a low temperature or high temperature process to form a hard ceramic or glass-ceramic structure or a metal-based structure with inorganic dielectric layers.

In some embodiments, the electrical conductivity of the top surface of the TCW 236 can be adjusted by altering the chemical composition of the top surface, coating the top surface with a conductive layer that has the desired electrical properties, or the like. The conductive layer may contact a WUT, for example. The top surface of the TCW 236 may be coupled to ground, and a relay may be used to control the coupling to be either an open circuit or a short circuit. For example, the coupling between the top surface of the TCW 236 and ground may be an open circuit during testing and a short circuit during modes for purposes of removing electrostatic charge.

The TCW 236 may comprise one or more heaters, wherein a heater may comprise a resistive trace that may emit thermal energy (heat) when a voltage differential is applied across its terminals due to Joule heating. The TCW 236 may be divided into one or more heating zones that can be independently controlled. One or more (e.g., each) heating zone may comprise at least one heater. For example, one heating zone may comprise multiple heaters. The heaters can be arranged so that they are independently electrically coupled, and/or two or more heaters are electrically coupled in series or in parallel. In some embodiments, the heaters may be located on a single conductive layer so that they are close to the top of the TCW 236, and thereby close to the WUT 201. In some embodiments, the heaters may be located on two or more conductive layers in the TCW 236.

In some cases, heaters are used to raise the temperature of thermal control elements or wafer chuck, but switching these heaters on and off can lead to electrical noise. In some embodiments, the TCW 236 comprises a shield layer located between the WUT 201 and the heaters (described in more detail below).

One aspect in the design of a TCW 236 is the number of independent electrical connections to the TCW 236. In some wafer probers, the space available (vertically, horizontally, and/or radially) at or proximate to the chuck assembly 130 may be limited. This limited space may make it difficult to route a large number of electrical connections to the TCW 236. In other words, it is advantageous to minimize the number of connections to the TCW 236 if possible. In thermal control systems for electrical testing, resistance temperature devices (RTDs) or other temperature measurement devices such as thermocouples may be used for measuring the temperature of a heater, heater zone, and/or heater assembly. In some instances, it is desirable to have a temperature measurement sensor (e.g., RTD) for each heating zone.

Figure 4:
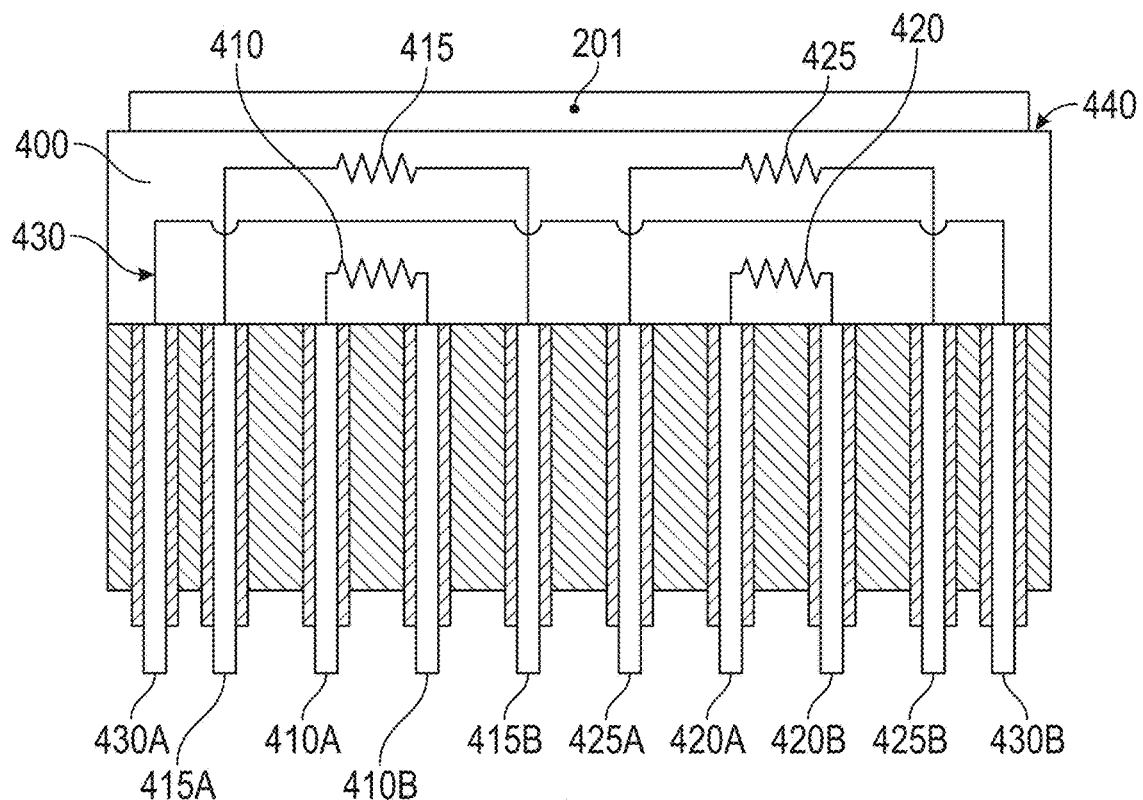
FIG. 4 illustrates a cross-sectional view of an example thermal control structure comprising a plurality of heater zones, according to some embodiments.

FIG. 4 shows a cross-sectional view of an example thermal control structure (also referred to as thermal control element) comprising a plurality of heater zones. A first heater zone comprises a first resistive heater 410 and a first temperature measurement device 415, and a second heater zone comprises a second resistive heater 420 and a second temperature measurement device 425. In some embodiments, a shield layer 430 is configured to shield the first and second resistive heaters 410 and 420 from a WUT 201. The WUT 201 may be adjacent to surface 440 of the thermal control structure. Heaters 410 and 420, temperature measurement devices 415 and 425, and shield layer 430 are conductive elements and may be embedded in a dielectric material 400. The heaters 410 and 420, temperature measurement devices 415 and 425, and shield layer 430 may communicate with a thermal controller or elements of a wafer prober via electrically coupled pins. For example, FIG. 4 shows pins 430A and 430B electrically coupled with the shield layer 430. The shield layer 430 may be electrically coupled to ground.

Although FIG. 4 shows two pins 430A and 430B, embodiments of the disclosure may include any number of pins (one, three or more) for coupling a shield layer 430 to ground. The pins may be used to communicate signals to and/or from a thermal controller and/or a power supply to the heaters 410 and 420 and/or the temperature measurement devices 415 and 425. For example, the resistive heater 410 in FIG. 4 may each comprise pins 410A and 410B, and the resistive heater 420 may comprise pins 420A and 420B. In some embodiments, pins 410A, 410B, 420A, and 420B may be used for electrically coupling a voltage potential across the resistive heaters 410/420, allowing current flow through the resistive heaters 410/420. The first resistive heater 410 is coupled to first set of pins 410A and 410B, and the second resistive heater 420 is coupled to second set of pins 420A and 420B. Temperature measurement devices (RTDs, thermocouples, diodes, etc.) may use at least two electrical connections, and therefore at least two pins. The first temperature measurement device 415 is coupled to pins 415A and 415B, and the second temperature measurement device 425 is coupled to pins 425A and 425B. In some embodiments, a thermal control structure comprising two heating zones uses eight pins 415A, 415B, 425A, 425B, 410A, 410B, 420A, and 420B and two conductive layers for heating and temperature measurement.

Figure 5:
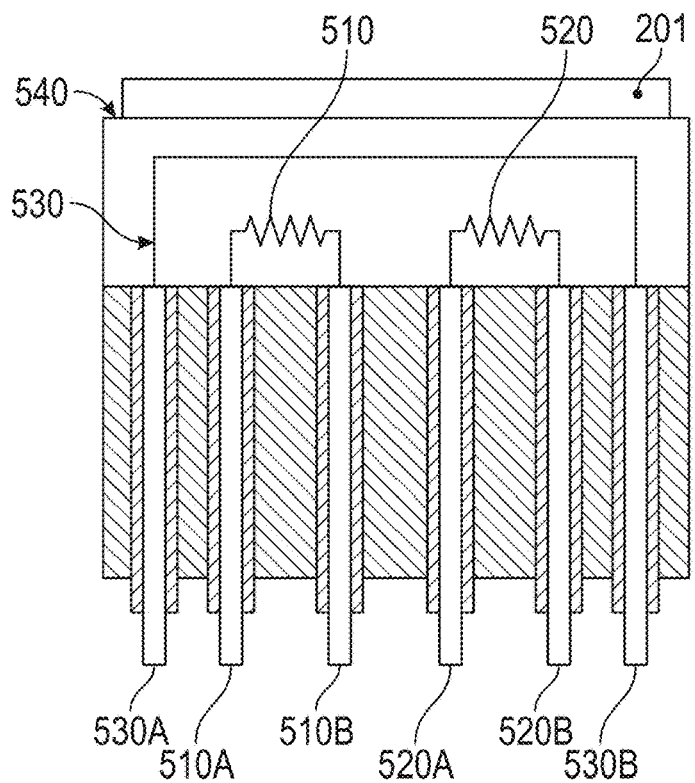
FIG. 5 illustrates a cross-sectional view of an example thermal control wafer (TCW) comprising a first heater zone that includes a first heating-sensing element and a second heater zone that includes a second heating sensing-element, according to some embodiments.

As shown in FIG. 5, the number of pins and/or the number of conductive layers used in the temperature measurement devices and heaters can be reduced (e.g., compared to the thermal control structure of FIG. 4). This reduction in the number of pins and the number of conductive layers may be due to using the same resistor for both heating (through Joule heating) and for measuring the temperature (through the Temperature Coefficient of Resistance (TCR) associated with the resistive trace material). In other words, the thermal control structure may use heating-sensing elements instead of discrete heaters and discrete temperature measurement devices.

FIG. 5 shows a cross-sectional view of an example TCW 236 comprising a first heater zone that includes a first heating-sensing element 510 and a second heater zone that includes a second heating sensing-element 520. Each heating-sensing element 510 or 520 may use two electrical connections, for example. During a time period when the corresponding heater zone is being heated (heating mode), heating-sensing elements 510 and 520 provide heat to the heater zone by Joule heating. During a time period when it is desirable to measure the temperature of the corresponding heater zone (sensing mode), heating-sensing elements 510 and 520 may have a resistance that varies according to their temperature as defined by the Temperature Coefficient of Resistance (TCR) of their constitutive material. The measured resistance can be used to determine the temperature of the heater zone based on calibration data (e.g., resistance versus temperature pre-established for each heating-sensing element). In other words, during sensing mode, the operation of the heating-sensing elements 510 and 520 may be similar to RTDs.

As shown in FIG. 5, the first heating-sensing element 510 may use two pins 510A and 510B, and the second heating-sensing element 520 may use two pins 520A and 520B. In some instances, the first and second heating-sensing elements 510 and 520 can be constructed in a single conductive layer in the TCW 236. In some embodiments, the TCW 236 comprises a shield layer 530 that shields the heating-sensing elements 510 and 520 from a WUT 201 (e.g., adjacent to surface 540 of TCW 236). The reduced number of pins and traces may simplify and reduce the costs for wiring of the TCW 236. Additionally, the reduced number of layers required for heating and temperature measurement may result in reduced thickness and mass for the TCW 236. A reduced mass for the TCW 236 allows it to change temperature quicker, reducing idle time for the wafer tester while it is waiting for the WUT to transition from one set point temperature to another. A reduced thickness for the TCW 236 allows reduced thermal resistance from the top side of the TCW 236 to the bottom side. This reduced thermal resistance translates directly to the reduced thermal mass of the TCW 236.

During the sensing mode, a heating-sensing element may use a 4-wire connection comprising two connections for a forcing current signal and two connections for voltage sensing across the heating-sensing element. The TCW 236 of FIG. 5 comprises two pins for each heating-sensing element 510 and 520 and would be able to accommodate a 4-wire connection and measurement. The pins may be attached to two wires or to two traces on a Printed Circuit Assembly (PCA). In some embodiments, the TCW 236 may comprise the traces for a 4-wire connection (discussed below with respect to FIG. 6A).

To achieve sufficiently high resistance to generate the desired heat during heating mode, the heating-sensing elements may have a relatively narrow trace width. In some aspects, other traces (non-heating-sensing traces) that electrically couple to the heating-sensing elements (e.g., heating-sensing elements 510 or 520) may be substantially wider than the heating-sensing traces. The non-heating-sensing traces may be, e.g., 5 times wider, 10 times wider, etc. than the heating-sensing traces. The non-heating-sensing traces may be configured to minimize heat through Joule heating and/or may be used where a low resistance is desired.

In some embodiments, the heating-sensing traces may comprise a material that has a higher electrical resistivity than the traces used for routing power, or for supply forcing current and sensing voltage of the heating-sensing elements. The material for the heating-sensing traces may have a resistivity that is two times, three times, four times, etc. greater than the lower electrical resistivity material. In some embodiments, wiring traces that are used for interconnection and that are not intended to contribute to the heating of heater zones have a resistance that is 1% or less of the overall trace resistance when the heating-sensing traces are included.

Figure 6A:
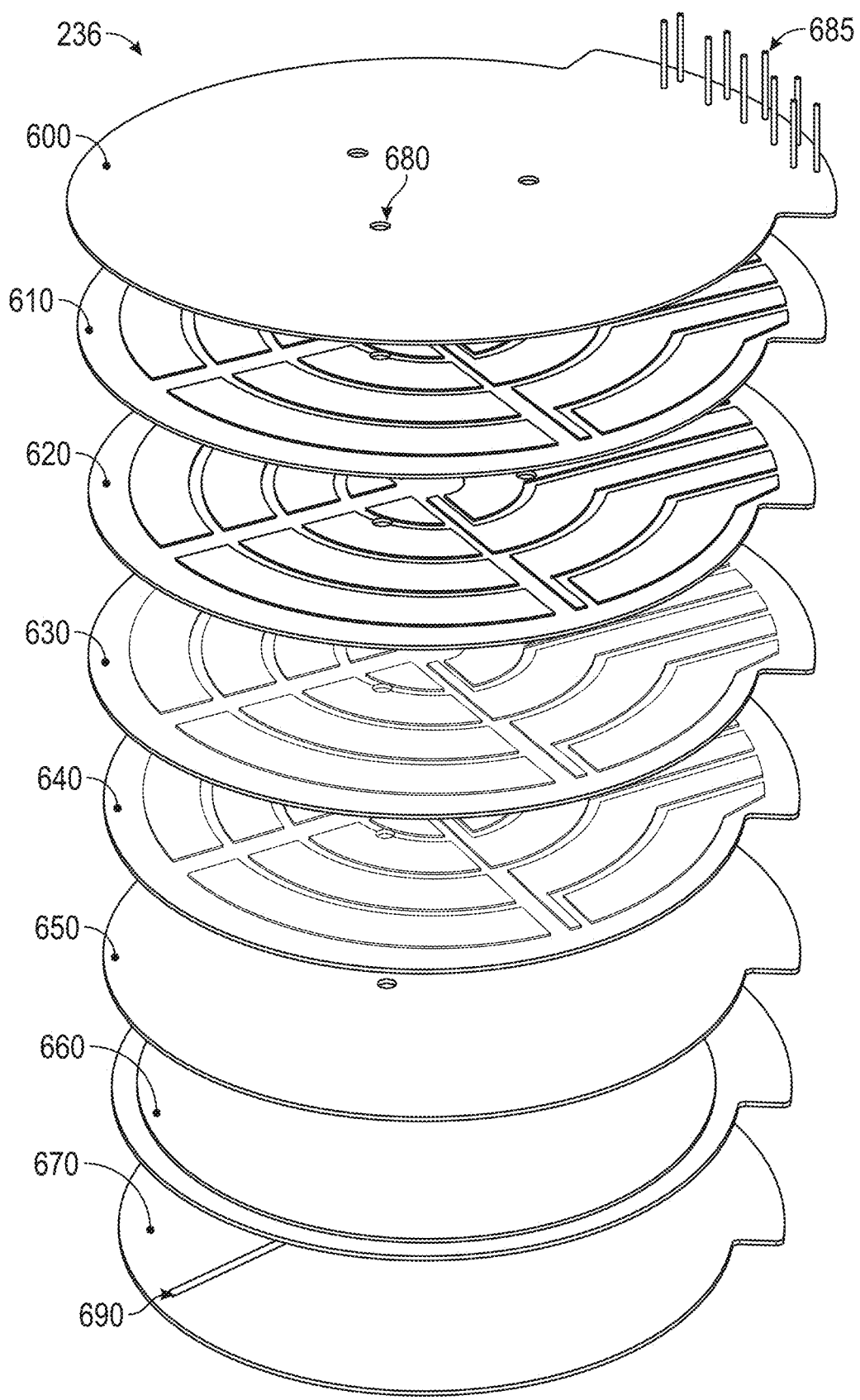
FIG. 6A illustrates an exploded view of an example layer-by-layer construction of a TCW, according to some embodiments.

FIG. 6A shows an exploded view of an example layer-by-layer construction of a TCW 236. In a wafer probing application, a TCW 236 may have a circular shape. The TCW 236 may have a diameter larger than the diameter of a WUT. For example, the TCW 236 may have a diameter of 320 mm for a corresponding 300 mm diameter WUT. In some embodiments, the size of the circular area of the TCW 236 may correspond to the size of the WUT 201. For example, the diameter of the circular area of the TCW 236 may be substantially the same as the diameter of the WUT 201 including, but not limited to, 150 mm, 200 mm, 300 mm, etc. In some embodiments, the TCW 236 may be larger than a single WUT 201 and may be capable of accommodating one or more smaller WUTs 201. In some embodiments, the thickness of the TCW may be about 3 mm. In instances, where the TCW 236 accommodates one or more smaller WUTs 201, the vacuum grooves 690 (shown in FIG. 9A) may be located according to the size and/or shape of the WUT(s) 201 such that there are no vacuum leaks when the TCW 236 is temporarily secured to the WUT(s) 201.

Figure 6B:
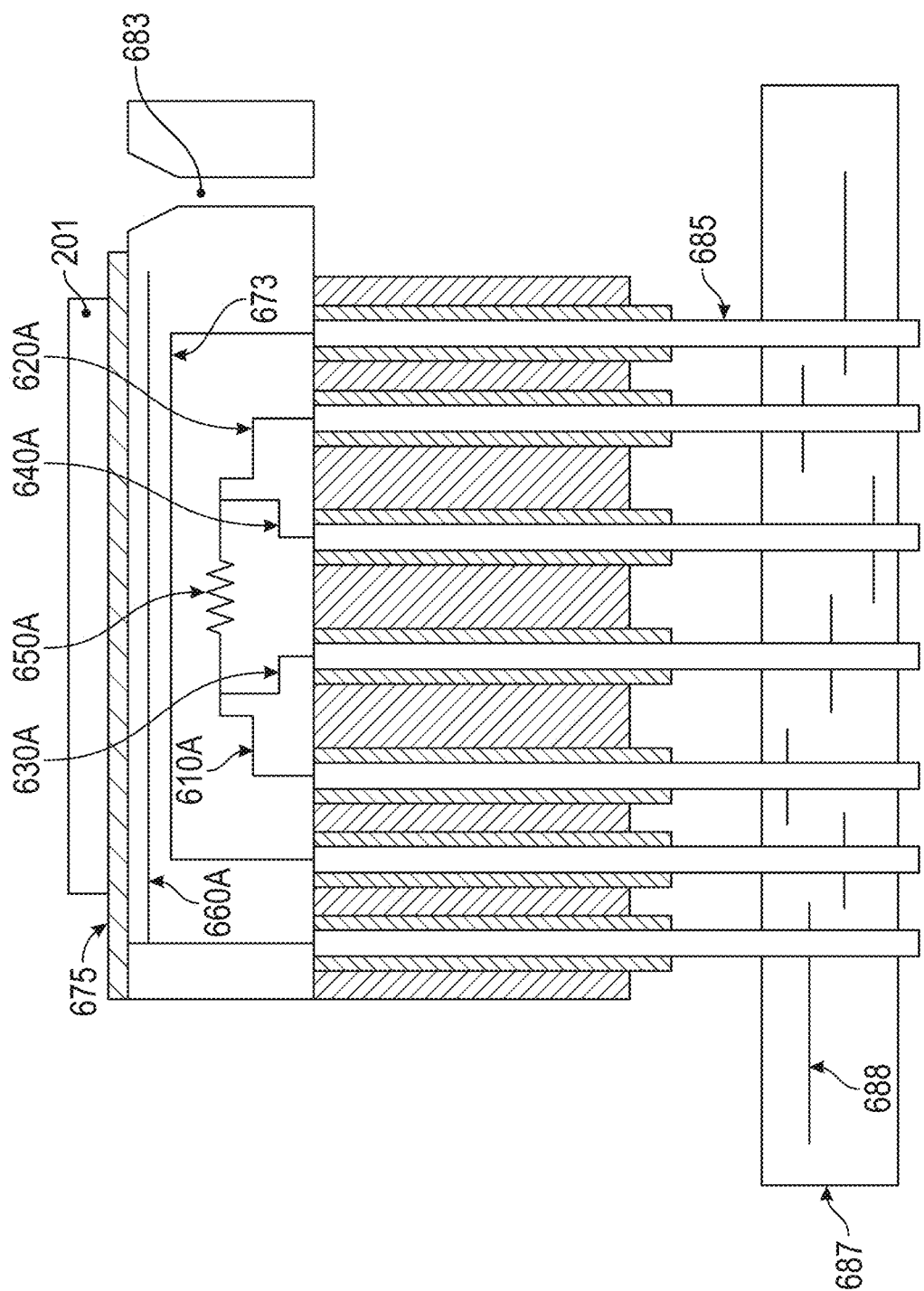
FIG. 6B illustrates a cross-sectional view of an example TCW, according to some embodiments.

Although the TCW 236 may be generally circular in shape, it may have other features such as protrusions from its edge to provide area for pins to be attached (shown in FIG. 6A) or for mechanical attachment points 683 (shown in FIG. 6B). The example TCW 236 shown in FIG. 6A has eight layers, but a TCW 236 may be constructed with fewer layers, such as 4 layers, with more layers such as 12 layers, or with any number of layers that is appropriate for the design of a particular TCW 236. The image in FIG. 6A is oriented to show the metal layers. When mounted on a prober chuck, the TCW would be flipped over such that layer 600 is resting on the top of the chuck and the pins 685 are oriented downward.

TCW 236 comprises a dielectric layer 600 as an outermost layer. Layer 600 may include grooves 690 (also referred to as channels) within its surface that function with a vacuum source to help hold the TCW 236 to the rest of a chuck assembly. Pins 685 attach to pads on an outer conductive layer, such as layer 610. The pins 685 may be attached by brazing, soldering, or other methods. The pins 685 may be covered by a condensation control cover and/or electrical insulation or otherwise surrounded. The TCW 236 and its pins 685 are designed to clear the rest of the chuck assembly (such as a coldplate or another layer). The pins 685 may attach to a PCA 687 (shown in FIG. 6B) that includes a thermal controller. The pins 685 may electrically couple conductive layers of the TCW 236 to the PCA 687. In some embodiments, TCW 236 comprises fewer pins 685, which allows for greater spacing between pins 685 and/or easier assembly. As described previously (and shown in FIG. 3), vias can pass through the dielectric layers (e.g., dielectric layer 600) to electrically couple two or more conductive layers (e.g., conductive layer 610) together, coupled to layer 650.

In some cases, there may be holes in a chuck or thermal control elements located between the chuck and a WUT. Holes, such as hole 680, may extend through the full thickness of TCW 236, e.g., extend vertically through the thermal control elements (such as a heater element or a cooling element such as a coldplate). The holes 680 may allow lifter pins to be vertically aligned with those holes and used to lift the wafer off the surface of the thermal control elements atop the chuck, or to provide for vacuum ports that can access grooves or channels on top of the chuck or thermal control elements such that a wafer can be held in place by a vacuum force. The holes 680 may accommodate lifter pins, or air blow-off ports. The lifter pins may be used to extend through holes in various layers of the chuck assembly. In a chuck assembly that includes a coldplate 232 and a TCW 236, the holes may extend through both the coldplate 232 and TCW 236. The lifter pins would vertically align with the holes 680, and during an unloading operation for a WUT, would lift the WUT away from the surface of the TCW 236.

The example TCW 236 of FIG. 6A shows a configuration, where the TCW 236 has the 4-wire measurement capability for the heating-sensing elements internal to the TCW 236. Layers 610 and 620 may comprise wiring interconnects for a force current input and output to one or more (e.g., each) heating-sensing elements. Layers 630 and 640 may comprise wiring interconnects for a voltage sensing input and output for one or more (e.g., each) heating-sensing elements.

Layer 650 includes the traces for the heating-sensing elements 650A (shown in FIG. 6B). Layer 660 may be a shield layer comprising a shield (the darker material shown in FIG. 6A or shield 660A shown in FIG. 6B). The shield 660A may extend substantially over the whole area of the TCW 236. The shield may be connected to ground, such as ground layer 688 of PCA 687 (as shown in FIG. 6B). Although the conductive shield on layer 660 is shown as a solid layer, it may also comprise multiple pieces or be arranged as a mesh. The shield layer, formed as a solid plane or as a mesh that covers substantially the whole surface of the TCW 236 except where vias, holes or other elements are present, acts to attenuate electromagnetic noise generated by switching on and off the heating-sensing elements that could interfere with the electrical testing of the WUT.

Layer 670 is an outermost dielectric layer and has grooves or channels supplying vacuum so that a WUT can be held in place on the TCW 236. The outermost dielectric layers 600 and 670 may be planarized through grinding, lapping, polishing or other operation. A smooth and flat outer surface may help make good contact for holding vacuum between the TCW 236 and the WUT or the rest of the chuck assembly. In some embodiments, one or both of the outer surfaces may have an average surface roughness Ra of 0.8 microns or less, and a flatness of 25 microns or 10 microns over a 300 mm diameter. In some embodiments, the outer surfaces of the TCW 236 may be planarized, improving the contact surface area between the surface and reducing the need for a TIM between the TCW 236 and the WUT or the rest of the chuck assembly.

The outermost layer (e.g., closest to the WUT), dielectric layer 670, or an additional outermost layer (dissipative layer 675 shown in FIG. 6B), may form a dissipative layer that is grounded, such as to ground 688 of PCA 687, to allow electrostatic charges that may be formed on the surface of the TCW 236 to be dissipated to ground. The dissipative layer may be formed by altering the formulation of the dielectric material of dielectric layer 670 itself or may be a dissipative layer 675, applied to dielectric layer 670, such as a conductive polymer layer, or a metal or other conductive material layer. An electrostatic dissipative layer has a resistance between $10^4$ and $10^{11}$ ohms.

The TCW 236 may also include a conductive layer 673 (shown in FIG. 6B) or the shield layer 660 may also function as an electrostatic chuck to assist with holding the WUT in place during operation. By applying an appropriate voltage differential between the WUT and a conductive layer in the TCW 236, an attractive Coulomb force can be created between the two elements. In other words, a first side of a voltage source may be coupled to a conductive layer of the TCW 236, and a second side of a voltage source may be coupled to a WUT so that the TCW 236 may act as an electrostatic chuck to hold the WUT on the TCW 236 when a voltage potential is applied using the voltage source.

Figure 7:
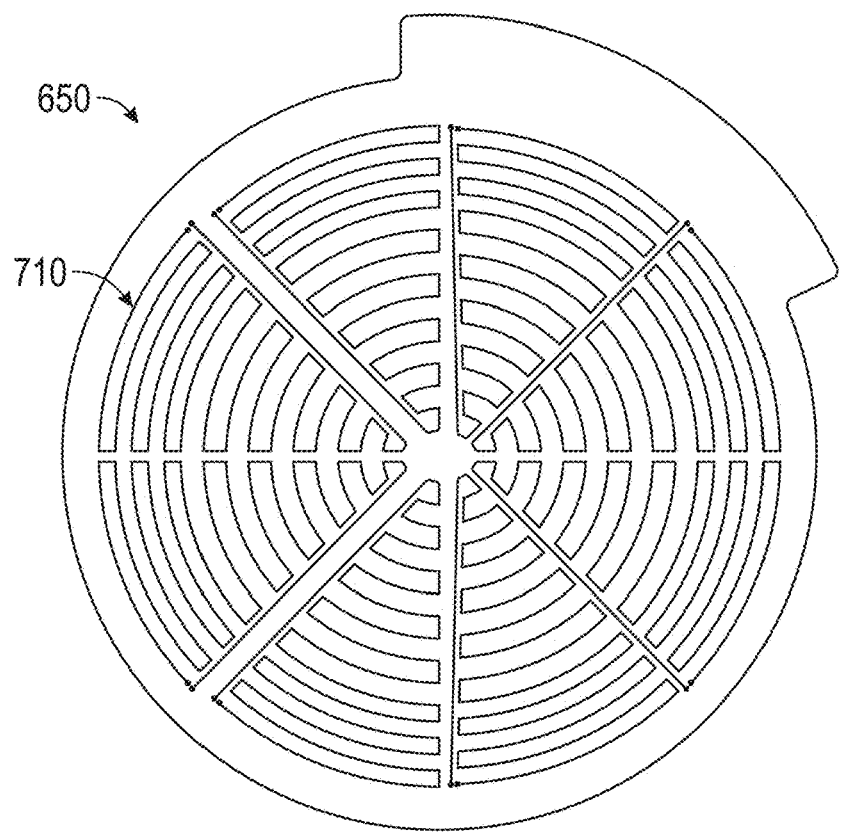
FIG. 7 illustrates eight heater zones arranged as octants within a TCW, according to some embodiments.

FIG. 7 is a more detailed view of the layer 650 shown in FIG. 6A. FIG. 7 shows eight heater zones arranged as octants within the TCW 236. An exemplary heating-sensing element trace 710 is depicted. The heating-sensing element trace 710 covers substantially the whole area of its heater zone and is designed to provide a uniform power density over its heater zone area. As previously noted, heater-sensing traces are relatively narrow so that their resistance is high, and they are efficient at converting electrical power to heat energy. The width and length of a heater-sensing trace, such as trace 710, may depend on one or more factors including, but not limited to, the desired heat output (power), the power supply voltage, the current-carrying capability of the trace, the desired power density, the number of heating zones, the number of heating-sensing elements, the number of electrical connections that need to be routed from the TCW 236 to the power and control system (also referred to as a thermal controller), the number of channels that the control system can provide and control, or other factors.

Because at different periods in time the same heater-sensing trace, such as trace 710, acts either as a heater or a temperature sensing element, it is expected that the measurement of the temperature of the heater zone may be more accurate than if the heater and temperature sensor are two separate elements as in the prior art solutions. Furthermore, if a thermal controller can measure the temperature quickly and at a high frequency then the stability of the temperature of the heater zone or the whole TCW 236 can be well controlled—such as to +/−0.1° C.

Although FIG. 7 shows a TCW 236 with heater zones arranged as octants, many different organizations of heater zones may be conceived. In some cases, a heater zone may be designed for each chip on a WUT. In other cases, a heater zone may be designed for groups of chips on a wafer. In yet another case, a single chip on a wafer may comprise two or more heater zones. In the cases where the heater zones have some relation to the layout of chips or groups of chips on the WUT, the heater zones may tend to be arranged in an orthogonal array. The disadvantage of a TCW 236 that is designed with respect to the chip layout on the WUT is that the TCW 236 is specific to one or a limited set of wafer designs. Testing of WUTs of different designs may require frequent changing from one TCW 236 to another that better matches the WUT chip layout. TCWs 236 that have heater zones that are designed without respect to the chip layout on the WUT may be used more universally with WUTs with many different chip layouts. Although FIG. 7 shows heater zones arranged in octants, generally any design with a polar or radial arrangement of heater zones, such as heater zones configured as concentric rings, concentric arcs, or sectors, or orthogonal arrays of heater zones that are not defined by the chip layout on the WUT 201 may be appropriate for testing WUTs with any chip layout.

Each heating zone may comprise one or more heater-sensing elements and may be configured to set or maintain a temperature above the temperature of a thermally coupled coldplate or corresponding cooling zone. In some embodiments, the heater zones may be configured as independently controllable heating zones.

In some embodiments, the areas of the heater zones and the power dissipation within the heater zones are designed so that there is the same power density in all the heater zones on a TCW 236. The power density capability during heating can be, for example, as high as 0.65 W/mm 2 or in other cases higher or lower.

Another advantage of the heating-sensing elements, such as 710, being both the heater and temperature sensing element is that a separate temperature sensor can create additional failure modes. For example, a failure in the temperature sensor may not be recognized as a failure, and corrective actions may not be taken to adjust the output of the heater. Furthermore, heating-sensing elements, such as 710, being both the heater and temperature sensor may produce less electrical noise than if they were separate elements—and less noise in the thermal control system may lead to more accurate thermal control.

Figure 8:
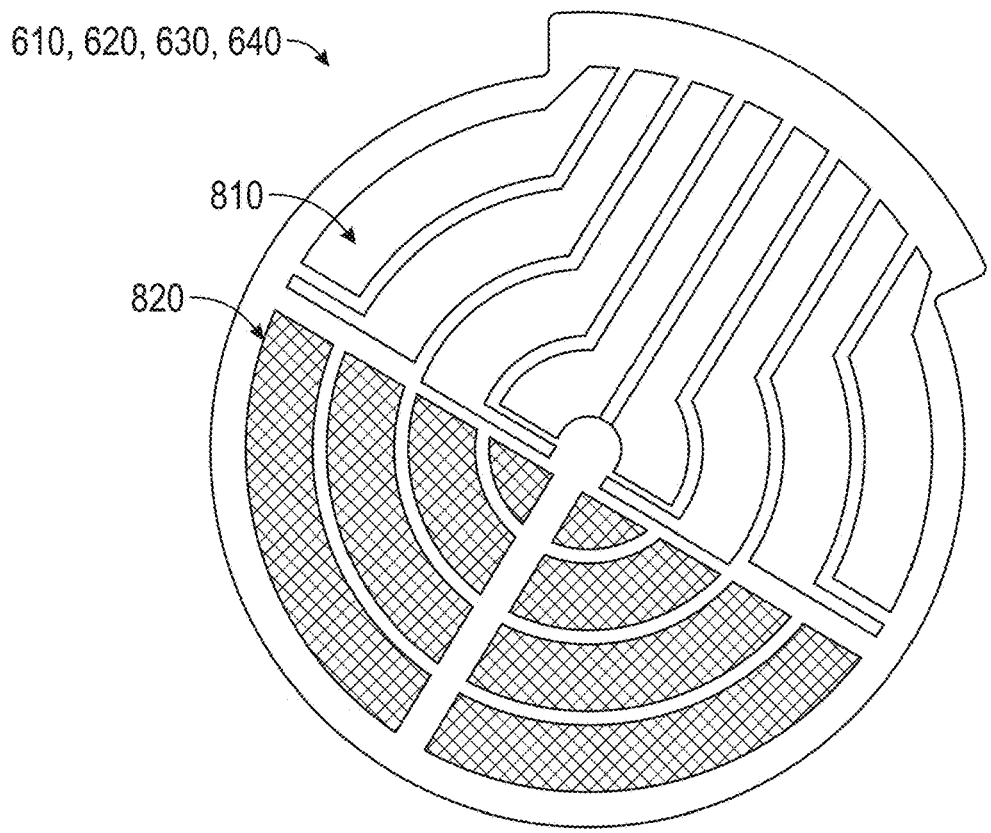
FIG. 8 illustrates an example of a wiring interconnect layer within a TCW, according to some embodiments.

FIG. 8 depicts an example of a wiring interconnect layer within the TCW 236, such as layer 610, 620, 630 or 640 of FIG. 6. The TCW 236 of FIG. 6 may be configured for a "4-wire" connection to one or more (e.g., each) heating-sensing element, such as heating-sensing element 710. These four connections (e.g., one for positive force current, one for negative force current, one for positive voltage differential measurement, and one for negative voltage differential measurement) may be active during the sensing mode (a time period when the resistance of the heating-sensing element is being measured so that the thermal controller can establish the temperature of the heating-sensing element). In the design shown in FIG. 6, each of the four connections may be routed on a separate conductive trace. As shown in FIG. 8, these trace interconnects, such as trace interconnect 810, are substantially wider than the heating-sensing element traces, such as trace 710, shown in FIG. 7.

Some ceramic, glass-ceramic, or other inorganic dielectric materials undergo shrinkage when they are fired, and their constituent particles are sintered together to form a solid material. Shrinkage can be on the order of 20% and can lead to a poor final product if the shrinkage is not uniform throughout the part. One way to help ensure uniform shrinkage is to balance the amount of conductive material on each layer so that both the amount of conductive material per unit area and the distribution of the conductive material over the area is uniform. There are eight interconnect traces depicted in FIG. 8, such as interconnect trace 810. For some designs, electrically active interconnect traces 810 occupy a portion (e.g., approximately half) of the surface area of the wiring interconnect layer. To balance the design, other portions of the surface of the wiring interconnect layer may comprise dummy fill areas, such as the eight dummy fill areas 820. The dummy fill areas 820 may not be electrically connected. In some embodiments, the dummy fill areas 820 are used to balance the conductive layer design so that uniform shrinkage occurs during firing of the TCW 236.

Figure 9A:
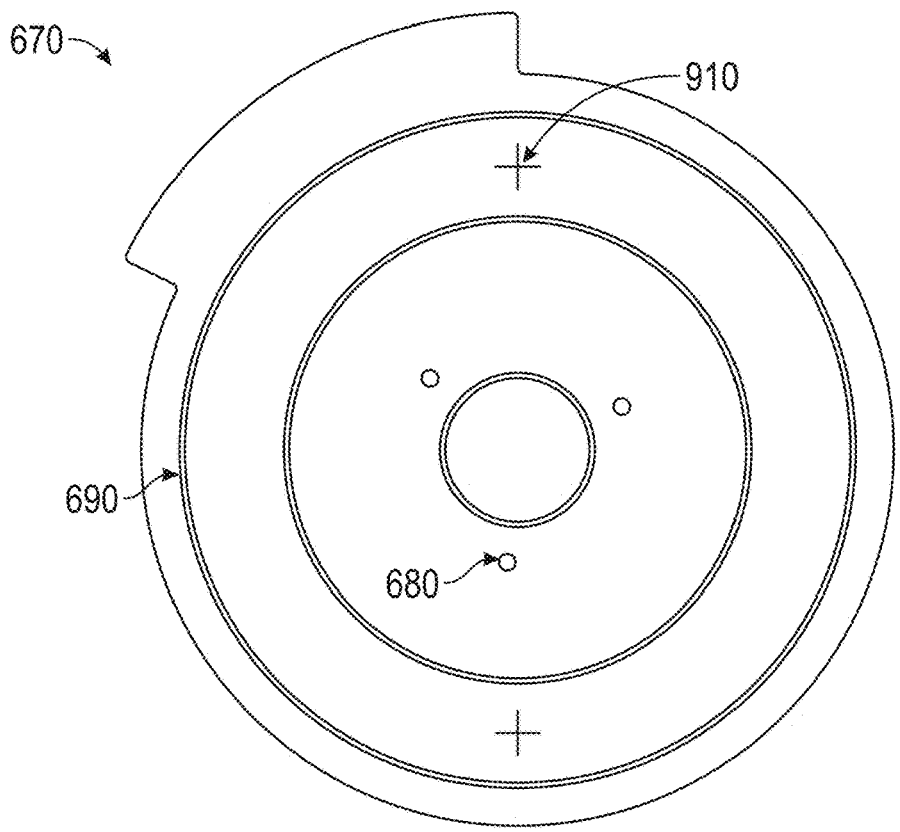
FIGS. 9A and 9B illustrate the outermost dielectric layer of a TCW, according to some embodiments.
Figure 9B:
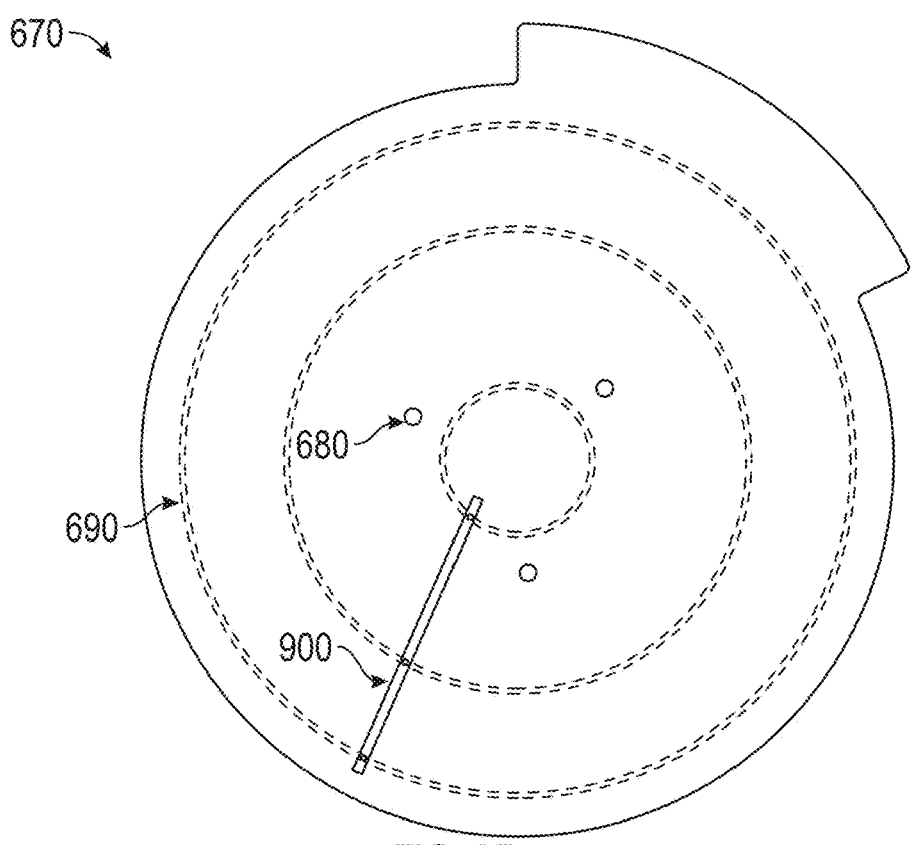

FIG. 9A and FIG. 9B depict the outermost dielectric layer of the TCW 236, layer 670 of FIG. 6. FIG. 9A depicts the side of layer 670 that would be, e.g., adjacent to the WUT during testing. Layer 670 comprises vacuum grooves 690 and through holes 680, as previously described. The surface of TCW 236 depicted in FIG. 9A may also include one or more fiducials 910, to allow the wafer prober to optically determine the position of the TCW 236 so that the WUT 201 can be properly aligned to the TCW 236 and ultimately the chuck assembly.

FIG. 9B depicts the side of layer 670 that would face the chuck assembly. Notably FIG. 9B shows a vacuum groove or channel 900 that is of a different configuration than the vacuum grooves 690 on the opposite side of this layer. Vacuum grooves 900 may be designed to couple to a vacuum port in the chuck assembly. In some embodiments, since the vacuum groove or channel 900 may only need to couple to the vacuum grooves 690 on the opposite side of the layer 670, its design may be simpler (such as a straight line as shown in the figure). Communication from the vacuum groove or channel 900 to the vacuum grooves 690 is provided by small through holes in the dielectric layer 670 that align with the vacuum grooves 690 and 900. In some embodiments, there may be different vacuum channels on the top surface and bottom surface.

The dielectric layer 600 is oriented towards the chuck assembly. In some cases, as depicted in FIG. 2, a TIM 234 is located between dielectric layer 600 of the TCW 236 and the chuck assembly, which may include a coldplate 232. In some cases, a TIM is used to increase or decrease thermal conductivity so that there is low thermal resistance between the elements it is located between. In some cases, a TIM is used to reduce its thermal conductivity so that there is a higher thermal resistance between the elements it is located between, in order to increase the amount of thermal isolation between the thermal control wafer and the chuck. The thermal conductivity may be between, e.g., the TCW and the chuck/coldplate. In some instances, an IC chip may be tested at a plurality of set point temperatures, so the wafer prober may change the temperature of one or more IC chips from a first set point temperature to a second set point temperature. If the second set point temperature is greater than the first set point temperature, then the test system may heat the IC chip(s), such as by use of a TCW 236. If the second set point temperature is less than the first set point temperature, then the test system may cool the IC chip(s), such as by use of a coldplate 232 or by reducing the power to the TCW 236. The wafer probe test system may wait until the measured temperature of the IC chip(s) and/or measured temperature of the heater zones is within a certain range of the set point temperature and/or is stable before testing the IC chip(s). It may be desirable to minimize the amount of time needed to change from the first set point temperature to the second set point temperature. The amount of time needed to change between the set point temperatures may be minimized when the rate of change in temperature is maximized.

The rate of temperature change can be adjusted based on one or more factors including, but not limited to, the properties of the TIM 234, the presence of a thermal decoupler between the TCW 236 and the coldplate 232, the configuration of the TCW 236, or a combination thereof.

In some instances, it may be desirable to balance the heating and cooling change times. For example, the amount of time needed to heat the DUT or a region of the DUT from a first set point temperature to a second set point temperature may be substantially the same as the amount of time needed to cool the DUT or the region of the DUT from the second set point temperature to the first set point temperature. In this manner, the rate of temperature change for heating is substantially the same as the rate of change for cooling. For example, the rate of temperature change for both heating and cooling can be 2° C. per second, 5° C. per second, or a higher rate of change. Balancing the heating and cooling rate may be accomplished by optimizing the TIM 234, controlling the heating power density, adjusting the fluid temperature or flow rate to a coldplate, or other means.

The WUT 201 or one or more IC chips on the WUT 201 can be heated at a fast rate when there is a high thermal resistance between the TCW 236 and the coldplate 232. In some embodiments, a higher thermal resistance may lead to a faster heating rate. A high thermal resistance between the TCW 236 and the coldplate 232 would mean high thermal isolation, or in some embodiments, a low thermal conductivity for the TIM 234.

The WUT 201 or one or more IC chips on the WUT 201 can be cooled at a fast rate when there is a low thermal resistance between the TCW 236 and the coldplate 232. In some embodiments, a lower thermal resistance may lead to a faster cooling rate. A low thermal resistance between the TCW 236 and the coldplate 232 would mean low thermal isolation, or in some embodiments, a high thermal conductivity for the TIM 234. In some embodiments, the properties of the TIM 234 can be such that the rates of temperature change when heating and cooling are substantially the same. For example, the TIM 234 of the disclosure may comprise a polymer film material having a thermal conductivity of about 0.1 W/mK and a thickness of 150 microns. Such a polymer TIM 234 may result in a rate of temperature change for both heating and cooling of about 2° C. per second.

In some embodiments, there is no TIM 234 material and instead the effect of thermal resistance control is created by altering the interface surface of the TCW 236 (layer 600) and/or the coldplate 232, or in other words altering the thermal contact resistance between adjacent surfaces.

Figure 9C:
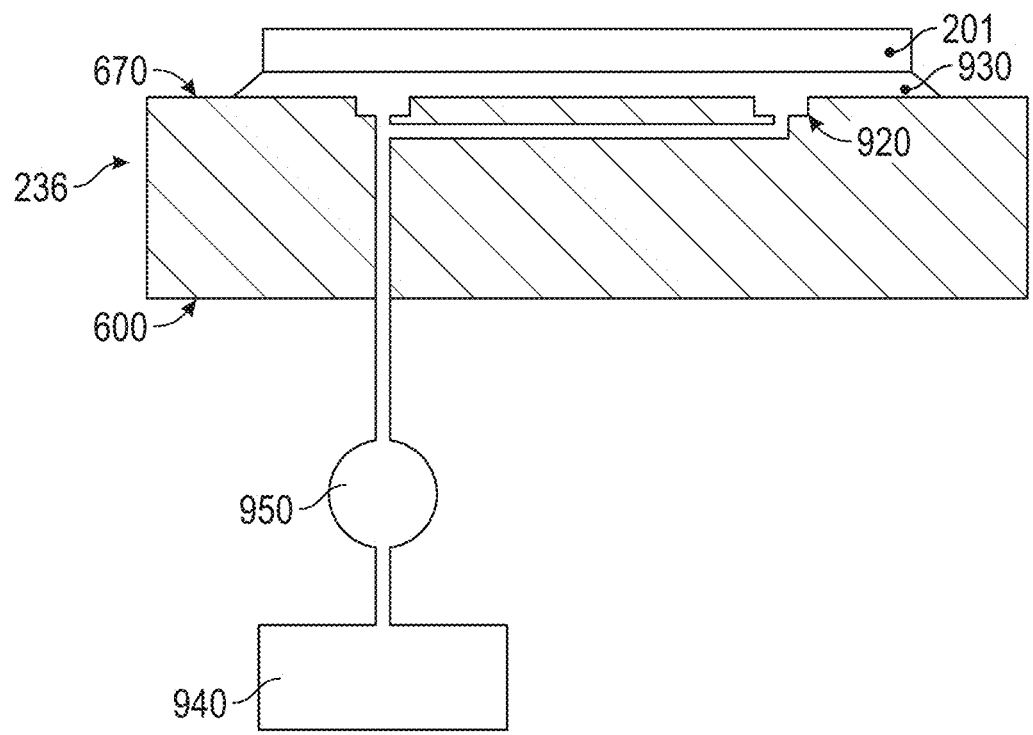
FIG. 9C illustrates an example pump to dispense water to or suck up water from an outer surface of a TCW, according to some embodiments.
Figure 9D:
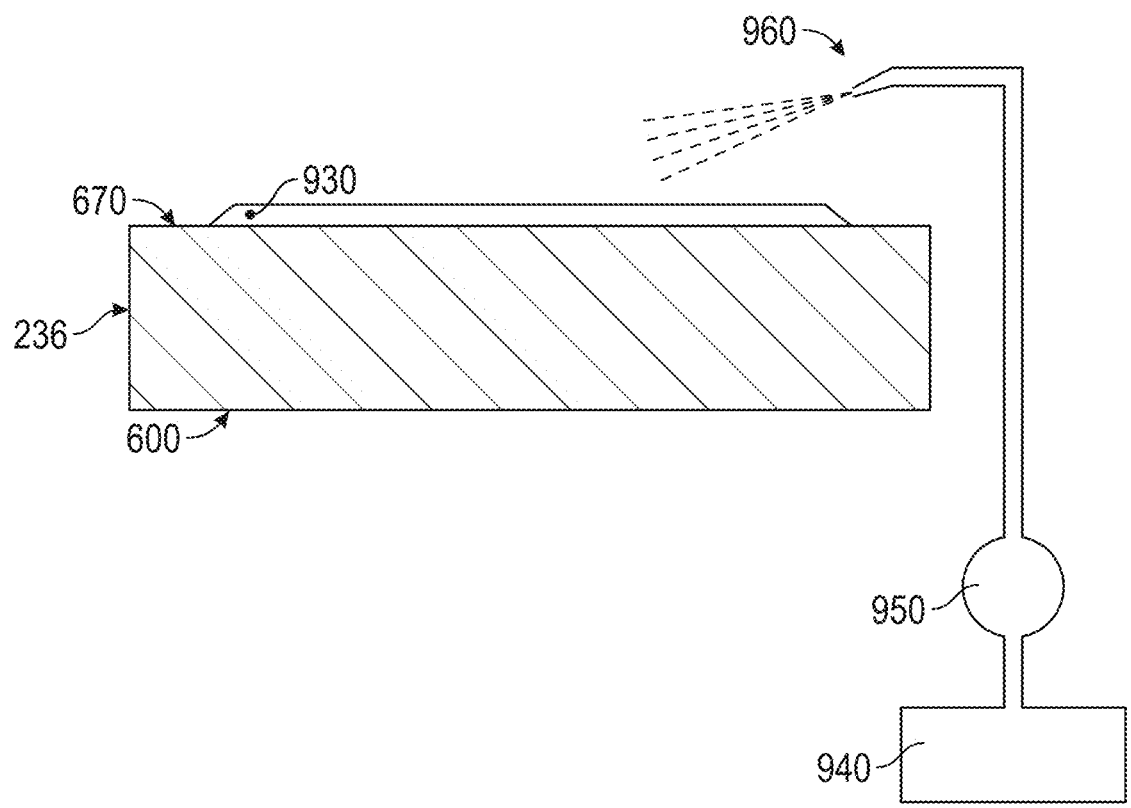
FIG. 9D illustrates a water-based TIM applied to one or more surfaces of a TCW via an applicator, according to some embodiments.

If a TIM material is located between the TCW 236 and the WUT 201, a low thermal resistance from the WUT 201 to the TCW 236 may be achieved. In some embodiments, the TIM material may comprise water. A benefit to using water as a TIM is that it can be applied in extremely thin layers. Since the thermal resistance of a TIM is based on the TIM's thermal conductivity and its thickness, these thin layers may help achieve a low thermal resistance. In some instances, there may be a thin layer of water in a gap between closely spaced surfaces that may remain in place due to capillary action. The thin layer of water may not flow or ooze out of the gap. Although not shown in FIG. 2, the TCW 236 could have holes or channels 920 to release water 930 to the outermost surface layer 670 that interfaces with the WUT 201 or to the bottommost surface layer 600 from a reservoir 940. These same holes or channels could be used to absorb excess water between test runs (e.g., in the time period when one wafer has finished testing and is being removed from the TCW 236 and another wafer is being prepared to be mounted to the TCW 236). For example, a pump 950 could be used to dispense water 930 to or suck up water 930 from an outer surface of the TCW 236 (shown in FIG. 9C). In some embodiments, during testing of a wafer, water may be added to one or more surfaces (top surface or bottom surface) of the TCW 236. The added water may compensate for any water lost due to evaporation, which may occur, e.g., over long test times. In some embodiments, as shown in FIG. 9D, the water-based TIM 930 may be applied to one or more surfaces of the TCW 236 via an applicator 960 external to the TCW 236 that sprays or otherwise deposits water on one or both of the outermost surfaces of the TCW 236. The water-based TIM 930 may be applied before a WUT is coupled to the TCW 236.

To use the heating-sensing elements as temperature sensors, the heating-sensing elements may be calibrated. In some embodiments, the calibration comprises determining the resistance of the heating-sensing elements at two ore more different temperatures, and determining an approximation (such as a linear approximation, a polynomial or other non-linear approximation, etc.) of the temperature versus resistance. The calibration data (e.g., correlation between temperature and resistance) are stored and accessed by the thermal control system. The thermal control system may use the calibration data for determining the temperatures during testing. In some aspects, the thermal control system can adjust heater power (e.g., through a pulse width modulation (PWM) scheme), coldplate fluid flow rate, or another factor to control the heater zone temperature to be close to a target temperature (also referred to as set point temperature).

The coldplate may be cooled by a coolant fluid, such as a liquid, refrigerant, or air. The fluid flow rate to the coldplate can be controlled by a flow valve that regulates the amount of fluid flow to the coldplate or that can be switched between allowing flow to the coldplate and stopping flow to the coldplate. The flow valve can be used to control the amount of heat energy (cooling) that the coldplate can absorb. The coldplate may be coupled to a chiller that extracts heat energy from hot fluid exiting an outlet of a coldplate and supplies cold fluid to an inlet of a coldplate.

The wafer prober 100 can comprise a thermal controller that controls the coldplate 232, the TCW 236, or a combination thereof to change or maintain one or more temperatures of the top surface 236T of the TCW 236 that is closest to and/or contacting the WUT 201. The thermal controller can control the temperature(s) of the entire top surface 236T of the TCW 236 or select zones of the top surface 236T. For example, the test system can change or maintain the temperature of a heater zone and thereby of an IC chip or a group of IC chips to within a certain range (e.g., within 1° C. of a set point temperature).

In some embodiments, the heating zones of a TCW 236 may be selectively activated. In instances where some, but not all, heating zones are activated at a given time, the heater power may be used by the activated heating zones, allowing for a higher power density for the activated heating zones for a given overall input power. A higher power density for a heating zone may allow it to respond to localized temperature changes quicker.

Embodiments of the disclosure comprise a thermal controller comprising a plurality of thermal control channels multiplexed to a plurality of heater zones. Each thermal control channel may be multiplexed to a unique heater zone. In some aspects, the number of thermal control channels may be the same as the number of heater zones.

Figure 10A:
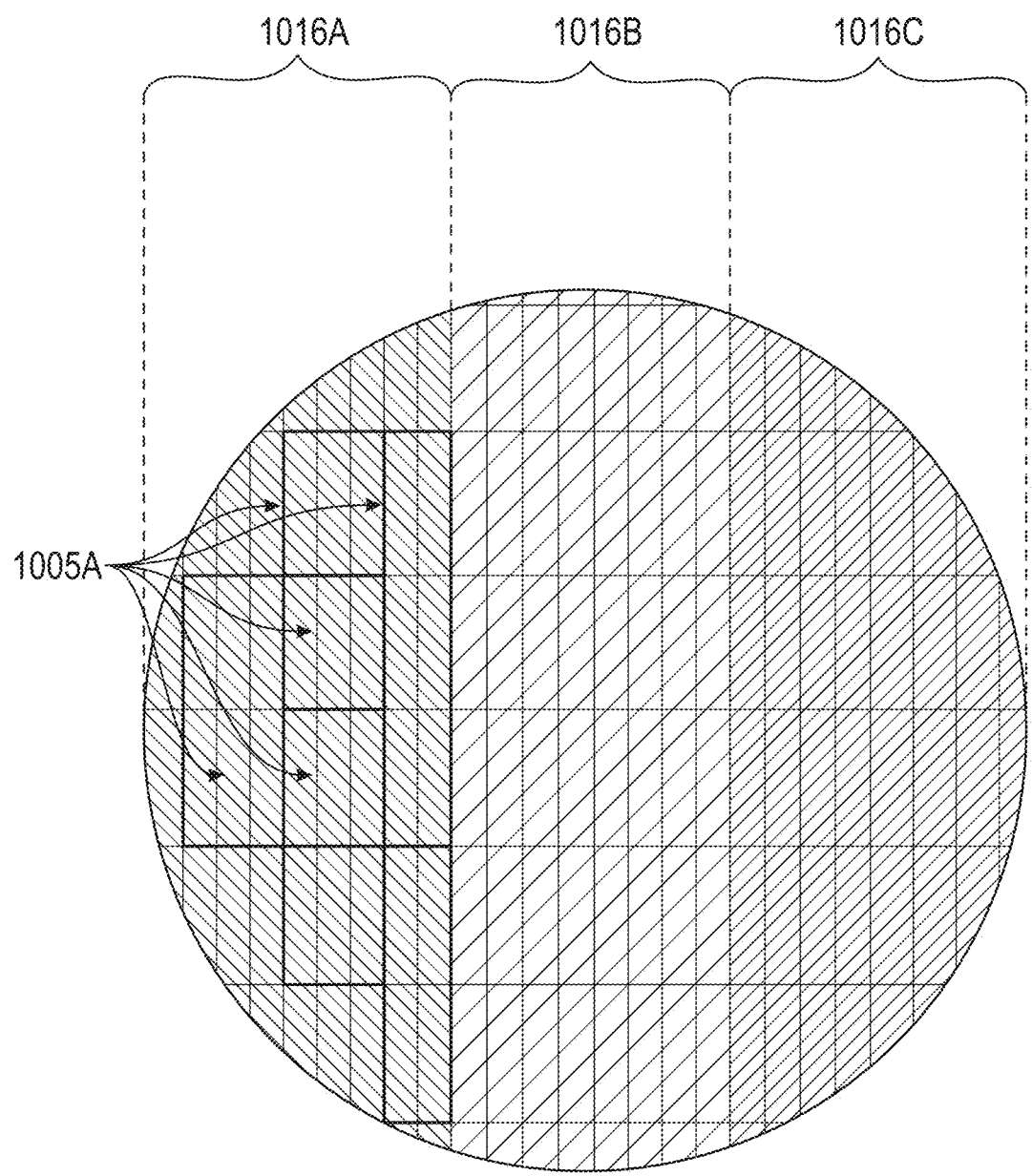
FIG. 10A illustrates a top, schematic view of an example plurality of heater zones configured as columns, according to some embodiments.
Figure 10B:
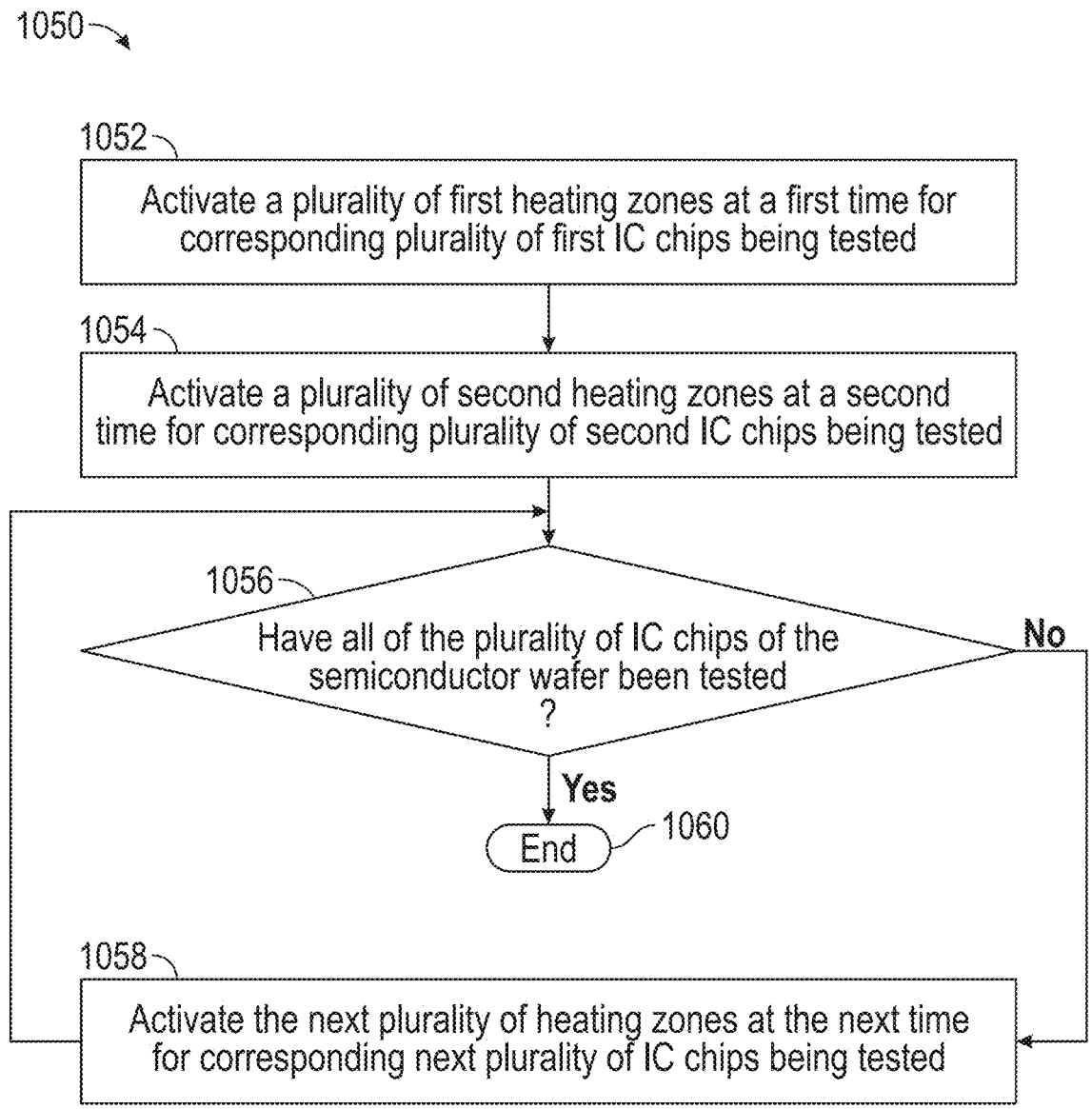
FIG. 10B illustrates a flowchart for activating the plurality of heater zones, according to some embodiments, according to some embodiments.

In some embodiments, the heater zones can be activated in a stepwise manner. For example, one or more first heater zones can be activated at a first time, one or more second heater zones can be activated at a second time, one or more third heater zones can be activated at a third time, etc. The heater zones can be activated according to the location of the IC chips being tested at a given time. FIG. 10A illustrates a top, schematic view of an example plurality of heater zones 1016 configured as columns, and FIG. 10B illustrates a flowchart for activating the plurality of heater zones, according to some embodiments. In step 1052 of process 1050, one or more first heater zones 1016A may be activated at a first time when corresponding one or more first IC chips 1005A are being tested. In step 1054 of process 1050, the next plurality of heater zones 1016 may be activated at the next time when the next plurality of IC chips is being tested. For example, the next plurality of heater zones may be one or more second heater zones 1016B activated at a second time when corresponding one or more second IC chips are being tested. The process may be repeated until some (e.g., all) of the IC chips 1005 on the WUT 201 are tested. For example, at step 1056, the test system can check whether the plurality of IC chips of the WUT 201 to be tested has been tested. If not, the next plurality of heater zones at the next time for corresponding next plurality of IC chips being tested can be activated at step 1058; e.g., a plurality of third heater zones 1006C are activated at a third time when corresponding plurality of third IC chips are being tested. If the plurality of IC chips of the semiconductor wafer to be tested have been tested, then the process 1050 can end (step 1060).

In some embodiments, one or more first heater zones 1016A may be located on the left side of the TCW 236, one or more second heater zones 1016B may be located in the middle, and a plurality of third heater zones 1016C may be located on the right side, as shown in FIG. 10A. In this manner, different heater zones may be activated at different times until a plurality (e.g., all) of the IC chips of the WUT 201 are tested. Embodiments of the disclosure may comprise other sequences for activating the heater zones, such as starting with the rightmost column heater zones and moving to the left of the TCW 236, starting with the topmost row heater zones and moving to the bottom of the TCW 236, starting with the bottommost row heater zones and moving to the top of the TCW 236, etc. In some embodiments, the sequence for activating the heater zones may be based on an addressing scheme; as one non-limiting example, starting with the heater zone in the first row and first column, then moving right across the columns and down through the rows.

The heater zones may be activated by stepping from a current location to a location far away from the current location. The stepping away from the current location may help move the heater zones away from, e.g., localized heating from the current test.

In some cases, the heater zones may be activated based on the locations of a chip or group of chips being tested, where the thermal controller has some knowledge of these locations (where a chip or group of chips being tested is located on the WUT 201). The thermal controller may receive an input indicative of a location of one or more DUTs being tested and control one or more heater zones associated with the location. In some cases, the thermal control system may have no knowledge of the location of a chip, or a group of chips being tested. In this situation, the thermal controller may attempt to maintain one or more (e.g., all) portions of the surface of the TCW 236 at a desired set point temperature. Maintaining the portion(s) at a desired set point may include stepping through the heater zones in some sequence and/or adjusting the heating (or cooling) of the heater zones individually. For example, the thermal controller may step through all the heater zones, and the thermal control system can rapidly determine heater zone temperature and adjust the power of the heater-sensing element based on the determination. Using the TCW 236 of FIG. 7 as an example, the thermal controller may step from one heater zone (octant) to an adjacent octant and proceed in this fashion around the entire surface of the TCW 236. Alternatively, the thermal controller may determine a different stepping pattern, such as stepping from one heater zone to a heater zone positioned on the opposite side of the TCW 236.

In some embodiments, the chuck assembly further comprises a coldplate, such as coldplate 232 shown in FIG. 2. The coldplate 232 may comprise a plurality of cooling channels that allow coolant to flow through. The coldplate 232 or its cooling zones may be configured to cool or maintain a temperature below the temperature of the corresponding TCW 236 and/or heating zones. The coldplate 232 may comprise one or more independently controllable cooling zones. In some embodiments, the number and/or configuration of the cooling zones may be substantially the same as the number and/or configuration of the heating zones. In some embodiments, the TCW 236 and the coldplate 232 in a chuck assembly may be separate components. By configuring the TCW 236 and the coldplate 232 as separate components, they may be easily switched out for purposes of, e.g., tailoring the chuck assembly for certain WUTs to be tested.

Figure 11:
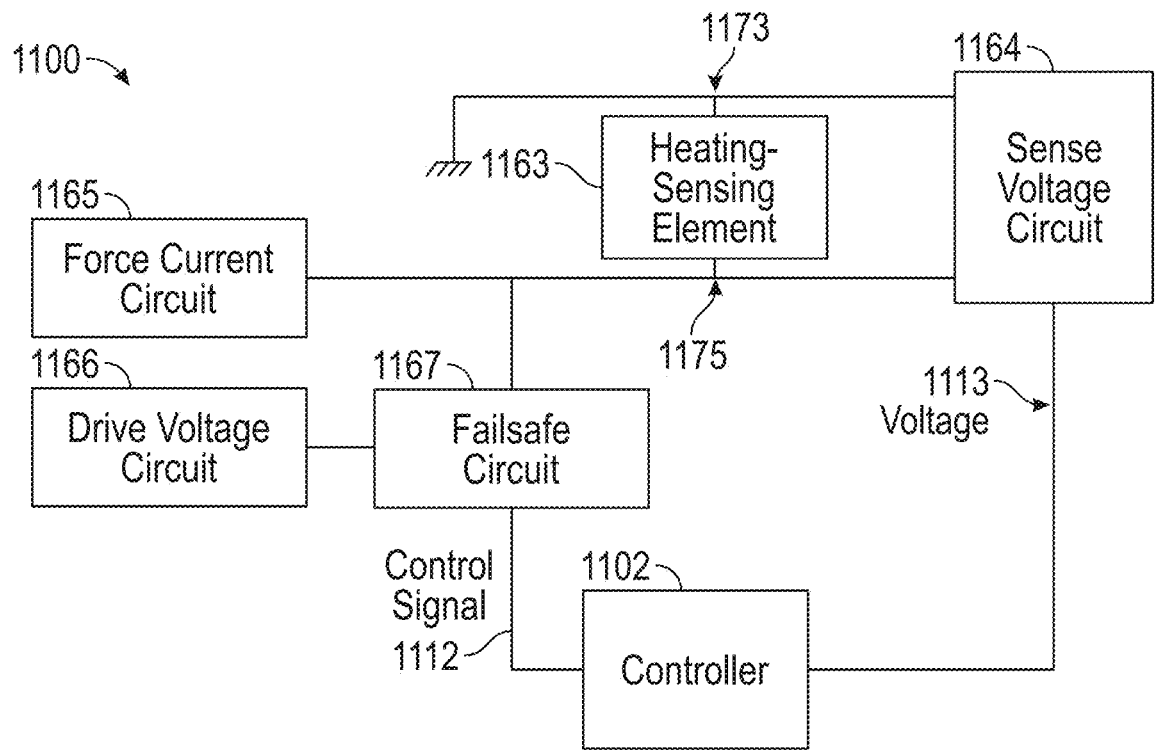
FIG. 11 illustrates a block diagram of an example circuit for a heating-sensing element, according to some embodiments.

FIG. 11 illustrates a block diagram of an example circuit for a heating-sensing element, according to embodiments of the disclosure. Heating-sensing circuit 1100 comprises a circuit for operating a heating-sensing element 1163 in a plurality of operation modes: heating mode, sensing mode, and off mode. Heating-sensing circuit 1100 comprises a drive voltage circuit 1166, a controller 1102, a force current circuit 1165, a sense voltage circuit 1164, and a failsafe circuit 1167. The drive voltage circuit 1166 may be coupled to the controller 1102, the failsafe circuit 1167, and a node 1175 of the heating-sensing element 1163. The drive voltage circuit 1166 receives one or more control signals 1112 from the controller 1102 and is configured to turn on the heating-sensing element 1163, causing it to generate heat during a heating mode. The drive voltage circuit 1166 may operate in accordance with the one or more control signals 1112, such as turning off the heating-sensing element 1163 to prevent it from generating heat (e.g., during sensing or off mode).

The force current circuit 1165 may be coupled to the controller 1102 and the node 1175 of the heating-sensing element 1163. The force current circuit 1165 provides a current signal to the heating-sensing element 1163 during the sensing mode in response to one or more control signals 1112 from the controller 1102. The current signal from the force current circuit 1165 causes a current to flow through the heating-sensing element 1163. The sense voltage circuit 1164, coupled to both nodes 1173 and 1175 of the heating-sensing element 1163, determines the voltage drop across the nodes 1173 and 1175 and generates the voltage signal 1113 indicative of this voltage drop. The voltage signal 1113 is processed (e.g., including converted by an analog-to-digital converter, amplified, etc.) and sent to the controller 1102. One skilled in the art would understand the controller may be implemented in hardware or software.

In some embodiments, the heating-sensing circuit 1100 comprises a failsafe circuit 1167. The failsafe circuit 1167 is configured to reduce the likelihood of or prevents one or more heating-sensing elements 1163 from overheating and/or failing. In some instances, the heating-sensing element 1163 may be inadvertently shorted to ground. With a short to ground, the controller 1102 determines the resistance of the heating-sensing element 1163 as being lower than its actual resistance. The controller 1102 may also determine the temperature of the heating-sensing element 1163 is lower than its actual temperature, which may cause the controller 1102 to try to increase the power to the heating-sensing element 1163 (if without the failsafe circuit 1167). Excess power may cause the heating-sensing element 1163 to generate too much heat and fail. The failsafe circuit 1167 prevents excess power from being sent to the heating-sensing element 1163, e.g., during the heating mode. In some embodiments, the failsafe circuit 1167 and/or controller 1102 may determine that one or more criteria have not been met and prevents the drive voltage circuit 1166 from providing a voltage to the heating-sensing element 1163. Example criteria including, but are not limited to, the temperature of the DUT being greater than a temperature threshold, the power of the DUT being greater than a power threshold, the heating-sensing element 1163 being shorted, or the heating-sensing element 1163 being an open circuit. For example, the controller 1102 may determine that the criteria have not been met and generates an error in response that is then communicated to the failsafe circuit 1167. In some embodiments, the failsafe circuit 1167 includes a fuse that fails and/or creates an open circuit when the heating-sensing element 1163 is shorted.

The controller 1102 determines the temperature of the heating-sensing element 1163 based on the voltage signal 1113 and the current signal from the force current circuit 1165. In some embodiments, the controller 1102 comprises an FPGA. Using an FPGA for thermal control may be beneficial due to its accuracy of the time base, or the level of precision due to the frequency used for timing. Any variation in the time base may distort the "D" or derivative term in a PID algorithm and cause errors in thermal control. Furthermore, an FPGA can support very fast floating-point calculations, which may be useful for the control algorithms. Additionally, an FPGA can support high frequencies (e.g., 5 kHz frequency, or in other words, a temperature measurement every 200 µs) for driving one or more control signals to a heating-sensing element 1163. A high rate of temperature measurements allows more precise control of the temperature of the heating-sensing elements 1163.

In some embodiments, the heating-sensing circuit 1100 operates as a feedback loop. The heating-sensing circuit 1100 causes the heating-sensing element 1163 to generate heat during a heating mode. The heating-sensing circuit 1100 also determines the resistance or temperature of the heating-sensing element 1163 during a sensing mode. The properties of the heating-sensing circuit 1100 during the heating mode is determined and/or dynamically adjusted based on the resistance or temperature determined during the sensing mode. The heating-sensing circuit 1100 alternates between the modes. In some embodiments, a time period includes one portion where the heating-sensing circuit 1100 operates in the heating mode, one portion where the heating-sensing circuit 1100 operates in the sensing mode, and optionally, one portion where the heating-sensing circuit 1100 operates in off mode. In the off mode, the heating-sensing element 1163 is neither generating heat nor sensing the temperature. In some embodiments, each heating-sensing element 1163 is associated with a unique heating-sensing circuit 1100.

Figure 12:
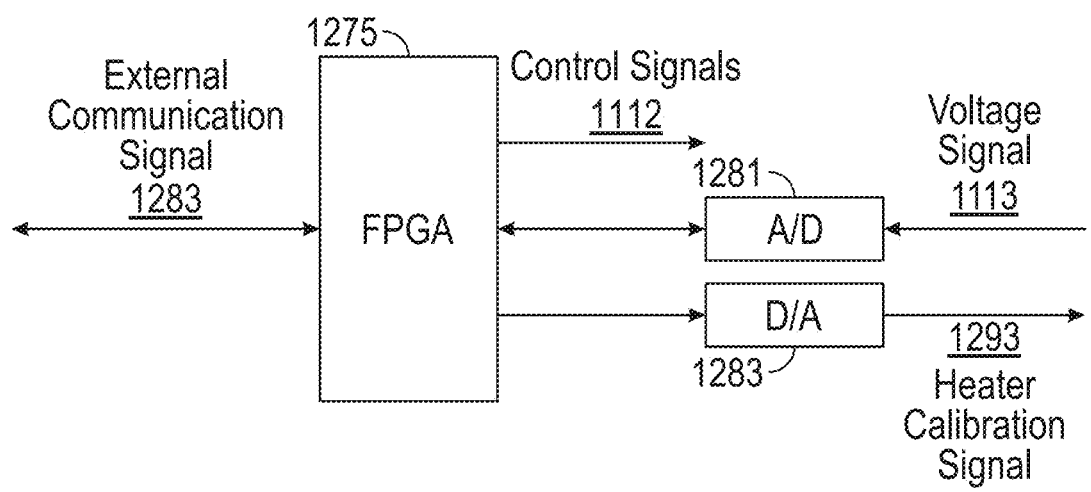
FIG. 12 illustrates a block diagram of an example controller, according to some embodiments.

FIG. 12 illustrates a block diagram of an example controller 1102, according to embodiments of the disclosure. Controller 1102 comprises one or more components, such as (but not limited to) an FPGA 1275 (or the like), A/D converter 1281, and D/A converter 1283. The FPGA 1275 may output one or more signals to D/A converter 1283, which then converts the signal to a heater calibration signal 1293 used to calibrate the heating-sensing element 1163 (as discussed above). The heater calibration signal 1293 may comprise calibration information, and in some embodiments, the calibration information may be used by the controller 302 to determine the measured temperature of a heating-sensing element. In other words, the thermal controller may determine a temperature of a heater zone by comparing the resistance of the resistive trace in that heater zone to calibration data for that resistive trace. The calibration data include a correlation between resistance and temperature for that resistive trace.

The A/D converter 1281 converts the voltage signal 1113, and then outputs the converted signal to FGPA 1275. The voltage signal 1113 may be indicative of a voltage drop across nodes of the heating-sensing element 1163. The voltage signal 1113 may be used to determine the measured temperature of the heating-sensing element.

Additionally, FPGA 1275 outputs one or more control signals 1112 to control the drive voltage circuit 1166 for generating and providing power to the heating-sensing element 1163 (as discussed above). In some embodiments, the FPGA 1275 may send and/or receive external communication signals to a controller (e.g., a higher level system controller 902 of FIG. 9).

In some embodiments, inputs other than the temperature of a heater zone may be used by the thermal controller. For example, the temperature of a chip (DUT temperature) or group of chips on the WUT 201 may be measured within the chip or group of chips itself—such as through forward-biasing a diode dedicated to temperature measurement located within a chip or multiple chips. Similarly the power of a chip (DUT power) or group of chips being tested on the WUT can be used as a thermal control input. In some embodiments, the thermal controller may obtain an input indicating DUT power, DUT temperature, or both. The controller may use this input to determine the amount of power to supply to a thermal control channel. The thermal controller may be configured to: determine a temperature of at least one heater zone, and receive an input indicative of a DUT power, a DUT temperature, or both. The thermal controller may control an amount of power to supply at least one of the plurality of thermal control channels based on the input and the determined temperature of at least one heater zone.

Figure 13:
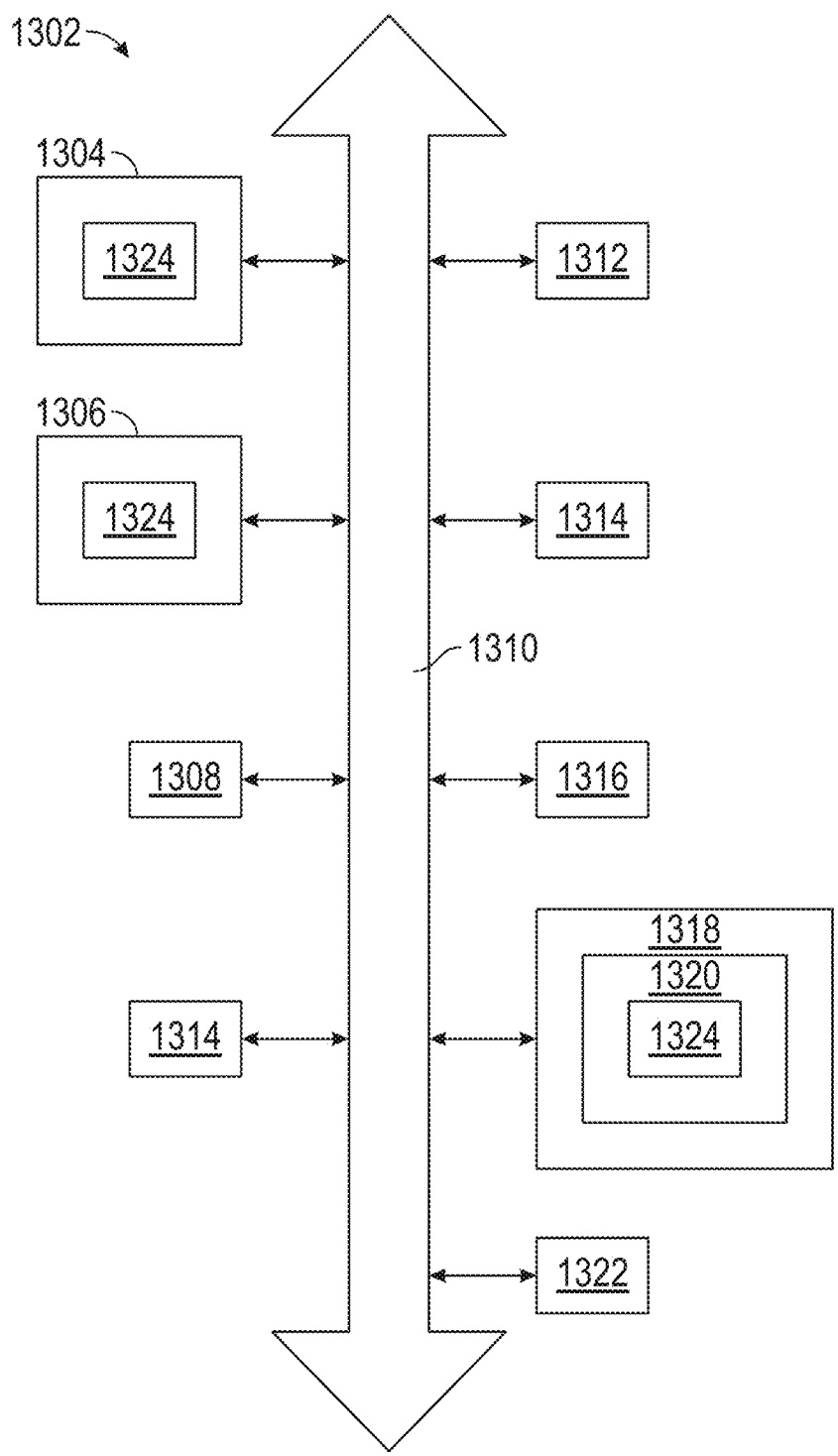
FIG. 13 illustrates a block diagram of an exemplary computer used for one or more controllers, according to some embodiments.

With respect to controlling a coldplate's fluid flow rate (and thus its cooling ability), the total power applied to the heater-sensing elements on the TCW 236 can be used as a control input. As discussed above, one or more controllers may be used for the test systems and/or thermal chuck assembly of the disclosure. FIG. 13 illustrates a block diagram of an exemplary computer 1302 used for one or more controllers, according to embodiments of the disclosure. The computer may be a machine, within which a set of instructions, causes the machine to perform any one of the methodologies discussed herein, may be executed, according to embodiments of the disclosure. In some embodiments, the machine can operate as a standalone device or may be connected (e.g., networked) to other machines. In a networked configuration, the machine may operate in the capacity of a server or a client machine in a server-client network environment, or as a peer machine in a peer-to-peer (or distributed) network environment. The machine can be a personal computer (PC), a tablet PC, a set-top box (STB), a personal digital assistant (PDA), a cellular telephone, a web appliance, a network router, a switch or bridge, or any machine capable of executing a set of instructions (sequential or otherwise) that specify actions to be taken by that machine. A mobile device may include an antenna, a chip for sending and receiving radio frequency transmissions and wireless communications, and a keyboard. Further, while only a single machine is illustrated, the term "machine" shall also be taken to include any collection of machines that individually or jointly execute a set (or multiple sets) of instructions to perform any one of the methodologies discussed herein.

The exemplary computer 1302 includes a processor 1304 (e.g., a central processing unit (CPU), a graphics processing unit (GPU), or both), a memory 1306 (e.g., read-only memory (ROM), flash memory, dynamic random access memory (DRAM) such as synchronous DRAM (SDRAM), etc.), and a static memory 1308 (e.g., static random access memory (SRAM), etc.), which can communicate with each other via a bus 1310.

The computer 1302 may further include a video display 1312 (e.g., a liquid crystal display (LCD) or light emitting diode (LED) display). The computer 1302 also includes an alpha-numeric input device 1314 (e.g., a keyboard), a cursor control device 1316 (e.g., a mouse), a disk drive unit 1318, a signal generation device, a network interface device 1322, and one or more wireless interface devices.

The computer 1302 may also include other inputs and outputs, including digital I/O and/or analog I/O. For example, the inputs and outputs may communicate with external devices, such as chillers, pressure controllers, force controllers, flow value controllers, etc., using any type of communication protocol.

The drive unit 1318 includes a machine-readable medium 1320 on which is stored one or more sets of instructions 1324 (e.g., software) embodying any one or more of the methodologies or functions described herein. The software may also reside, completely or at least partially, within the main memory 1306 and/or within the processor 1304 during execution thereof by the computer 1302, the main memory 1306 and the processor 1304 also constituting machine-readable media. The software may further be transmitted or received over a network via the network interface device 1322 and/or a wireless device.

While the machine-readable medium 1320 is shown in an exemplary embodiment to be a single medium, the term "machine-readable medium" should be taken to include a single medium or multiple media (e.g., a centralized or distributed database and/or associated caches and servers) that store the one or more sets of instructions. The term "machine-readable medium" shall also be taken to include any medium that is capable of storing, encoding, or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. An apparatus for controlling one or more temperatures of a plurality of heater zones related to devices under test (DUTs), the apparatus comprising:
   a thermal control wafer (TCW) comprising the plurality of heater zones, wherein the plurality of heaters zones is independently controllable and configured to heat the DUTs, wherein at least one of the plurality of heater zones has:

a heater-sensing element comprising a resistive trace that:
   generates heat through Joule heating during a heating mode, and
   provides a resistance during a sensing mode;
a coldplate disposed under the TCW, wherein the TCW is disposed below the DUTs; and
a thermal controller configured to determine a temperature of the at least one heater zone based on the resistance.

2. The apparatus of claim 1, wherein:
at least one of the DUTs comprises a chip on a semiconductor wafer; and
the at least one heater zone has an area that is substantially the same as an area of the chip.

3. The apparatus of claim 1, wherein:
at least one of the DUTs comprises a group of chips on a semiconductor wafer; and
the at least one heater zone has an area that is substantially the same as an area of the group of chips.

4. The apparatus of claim 1, wherein:
at least one of the DUTs comprises a chip on a semiconductor wafer;
the at least one heater zone has an area that is smaller than an area of the chip; and
a combined area of at least two of the plurality of heater zones is substantially the same as the area of the chip.

5. The apparatus of claim 1, wherein:
at least one of the DUTs comprises a chip or a group of chips on a semiconductor wafer; and
the at least one heater zone has an area that is larger than an area of the chip or the group of chips.

6. The apparatus of claim 1, wherein the TCW has an area that is substantially the same as an area of a wafer under test (WUT), the WUT comprising one or more of the DUTs.

7. The apparatus of claim 1, wherein a diameter of the TCW is about 150 mm, 200 mm, or 300 mm, and a thickness of the TCW is 3 mm or less.

8. The apparatus of claim 1, further comprising:
a thermal interface material (TIM), wherein the TIM is located between the TCW and the coldplate, between the TCW and a wafer under test (WUT), or both,
wherein the WUT comprises one or more of the DUTs.

9. The apparatus of claim 8, wherein a thermal conductivity of the TIM is between 1 to 10 W/mK.

10. The apparatus of claim 8, wherein the TIM is located between the TCW and the coldplate, and a thermal conductivity of the TIM is about 0.2 W/mK.

11. The apparatus of claim 1, further comprising:
a thermal interface material (TIM) disposed between a surface of the TCW and a wafer under test (WUT), wherein the TIM comprises water.

12. The apparatus of claim 11, further comprising:
a pump that dispenses at least some of the water on the surface of the TCW during testing.

13. The apparatus of claim 1, wherein the TCW is capable of absorbing or removing water from a surface of the TCW between test runs.

14. The apparatus of claim 1, wherein the TCW comprises one or more layers of inorganic dielectric material and one or more layers of conductive material.

15. The apparatus of claim 14, wherein the TCW comprises a base metal layer, the one or more layers of inorganic dielectric material and the one or more layers of conductive material are disposed over the base metal layer.

16. The apparatus of claim 1, wherein the plurality of heater zones comprises a plurality of heater-sensing elements, and wherein the resistive traces of the plurality of heating-sensing elements are on one conductive layer.

17. The apparatus of claim 1, wherein the plurality of heater zones comprises a plurality of heater-sensing elements, and wherein the resistive traces of the plurality of heating-sensing elements are located on two or more conductive layers.

18. The apparatus of claim 1, wherein the at least one of the plurality of heater zones comprises two or more resistive traces.

19. The apparatus of claim 18, wherein the two or more resistive traces are electrically coupled together in series or in parallel.

20. The apparatus of claim 1, wherein the TCW comprises:
conductive traces having a width that is at least five times wider than widths of the resistive traces of the heating-sensing elements.

21. The apparatus of claim 1, wherein the TCW comprises:
a first conductive layer comprising the resistive trace of the heater-sensing element of the at least one heater zone;
a second conductive layer configured as a shield layer, wherein the second conductive layer is located closer to an upper surface of the TCW than the first conductive layer,
wherein the upper surface of the TCW is configured for contacting a wafer under test (WUT), the WUT comprising one or more of the DUTs, wherein the shield layer is coupled to an electrical ground.

22. The apparatus of claim 1, wherein the TCW comprises:
interconnect traces configured to form one or more four-wire connections, wherein the resistive trace of the heating-sensing element is electrically coupled to at least one of the one or more four-wire connections.

23. The apparatus of claim 22, wherein wires of at least one of the one or more four-wire connections are located on different conductive layers of the TCW.

24. The apparatus of claim 1, wherein the TCW comprises:
interconnect traces configured to form one or more two-wire connections, wherein the resistive trace of the heating-sensing element is electrically coupled to at least one of the one or more two-wire connections.

25. The apparatus of claim 24, wherein the TCW comprises:
a plurality of pins electrically coupling the one or more two-wire connections to one or more four-wire connections, wherein the one or more four-wire connections electrically couples to circuitry.

26. The apparatus of claim 25, wherein a wire of at least one of the one or more two-wire connections is located on different conductive layers of the TCW.

27. The apparatus of claim 1, wherein a top surface of the TCW is electrically coupled to ground and is configured to dissipate electrostatic charges.

28. The apparatus of claim 1, wherein the TCW comprises:
conductive traces having an electrical resistivity that is 2-4 times less than an electrical resistivity of the resistive traces of the heating-sensing elements.

\* \* \* \* \*